US012610733B2

(12) United States Patent
    Padture et al.

(10) Patent No.: US 12,610,733 B2
(45) Date of Patent: Apr. 21, 2026

---

(54) PEROVSKITE SOLAR CELLS WITH SELF ASSEMBLED MONOLAYERS

(71) Applicant: Brown University, Providence, RI (US)

(72) Inventors: Nitin P. Padture, Providence, RI (US); Zhenghong Dai, Providence, RI (US)

(73) Assignee: Brown University, Providence, RI (US)

( * ) Notice: Subject to any disclaimer, the term of this patent is extended or adjusted under 35 U.S.C. 154(b) by 0 days.

(21) Appl. No.: 18/286,109

(22) PCT Filed: Apr. 8, 2022

(86) PCT No.: PCT/US2022/023980
     § 371 (c)(1),
     (2) Date: Oct. 7, 2023

(87) PCT Pub. No.: WO2022/250795
     PCT Pub. Date: Dec. 1, 2022

(65) Prior Publication Data
     US 2024/0188313 A1      Jun. 6, 2024

Related U.S. Application Data

(60) Provisional application No. 63/172,795, filed on Apr. 9, 2021.

(51) Int. Cl.
     *H10K 85/50*      (2023.01)
     *H10K 30/00*      (2023.01)
     *H10K 30/50*      (2023.01)
     *H10K 85/10*      (2023.01)
(52) U.S. Cl.
     CPC ............. *H10K 85/50* (2023.02); *H10K 85/10* (2023.02); *H10K 30/451* (2023.02); *H10K 30/50* (2023.02)

(58) Field of Classification Search
     None
     See application file for complete search history.

(56) References Cited

U.S. PATENT DOCUMENTS

2020/0157125 A1      5/2020   Irwin et al.

FOREIGN PATENT DOCUMENTS

WO         2022250795 A2      12/2022

OTHER PUBLICATIONS

Ogomi et al., J. Phys. Chem. C, 2014, 118, 16651-16659. (Year: 2014).*
Masi et al., 2020 47th IEEE Photovoltaic Specialists Conference, pp. 1183-1185. (Year: 2020).*
Feb. 8, 2023—(WO) International Search Report & Written Opinion—App. No. PCT/US2022/023980.
Cao et al., "Thiols as interfacial modifiers to enhance the performance and stability of perovskite solar cells", Nanoscale, 2015, pp. 1-5.
Ogomi et al., "All-solid Perovskite Solar Cells with HOCO-R-NH3+ I—Anchor-group Inserted between Porous Titania and Perovskite", The Journal of Physical Chemistry, 2014, pp. 1-24.

(Continued)

*Primary Examiner* — Eli S Mekhlin
(74) *Attorney, Agent, or Firm* — Banner & Witcoff, Ltd.

(57) ABSTRACT

A laminated structure is prepared by providing a self-assembled monolayer between an ETL and an MHP layer, wherein the self-assembled monolayer is formed by a monomer having the formula halide-alkyl linker-anchor moiety.

31 Claims, 14 Drawing Sheets

(56)  References Cited

OTHER PUBLICATIONS

Li et al. "Chemical modification of n-type material naphthalene diimide on ITP for efficient and stable inverted polymer solar cells", Langmuir, vol. 33, No. 35, 2017, pp. 1-24.

Dai et al. "Interfacial toughening with self-assembled monolayers enhances perovskite solar cell reliability", Science, vol. 372, 2021, pp. 1-5.

* cited by examiner

PEROVSKITE SOLAR CELLS WITH SELF ASSEMBLED MONOLAYERS

CROSS-REFERENCE TO RELATED APPLICATIONS

This patent application is a National Stage Application under 35 U.S.C. 371 of co-pending PCT application PCT/US2022/23980 designating the United States and filed Apr. 8, 2022; which claims the benefit of and priority to U.S. Provisional Patent Application No. 63/172,795, filed on Apr. 9, 2021, the contents of each are hereby incorporated by reference in their entireties.

STATEMENT OF GOVERNMENT INTERESTS

This invention was made with government support under grant number 1538893 awarded by the National Science Foundation and grant numbers N00014-17-1-2232 and N00014-20-1-2574 awarded by the Office of Naval Research. The government has certain rights in the invention.

BACKGROUND

The field of thin-film photovoltaics includes perovskite solar cells that use hybrid perovskites as the light absorber. The promise of low cost, high power conversion efficiency (PCE), and versatility has driven research efforts on perovskite solar cells (PSCs) (see Park et al., *Organic-Inorganic Halide Perovskite Photovoltaics: From Fundamentals to Device Architectures*. (Springer, Zurich, Switzerland, 2016); Snaith. "Present status and future prospects of perovskite photovoltaics," *Nat. Mater.* 17. 372-376 (2018); Jena et al., "Halide perovskite photovoltaics: background, status, and future prospects," *Chem. Rev.* 119, 3026-3103 (2019)). The low formation energies of metal-halide perovskites (MHPs) light absorbers that enable solution-processing at or near room temperature (see Dunlop-Shohl et al., "Synthetic approaches for halide perovskite thin films." *Chem. Rev.* 119. 3193-3295 (2019)) also makes them unstable (see Rong et al., "Challenges for commercializing perovskite solar cells." *Science* 361, 1214 (2018); Dunfield et al., "From Defects to Degradation: A mechanistic understanding of degradation in perovskite solar cell devices and modules," *Adv. Energy Mater.* 10, 1904054 (2020)). Research on improving PSC operational stability (see Rong et al.; Dunfield et al.) has made steady progress, but PSCs will also need to be mechanically reliable if they are to operate efficiently for decades (see Dunfield et al.; Rolston et al., "Mechanical integrity of solution-processed perovskite solar cells," *Extreme Mech. Lett.* 9, 353-358 (2016); Ramirez et al., "Thermo-mechanical behavior of organic-inorganic halide perovskites for solar cells," *Scripta Mater.* 150, 36-41 (2018); Rolston et al., "Effect of cation composition on the mechanical stability of perovskite solar cells," *Adv. Energy Mater.* 8, 1702116 (2018); Yadavalli et al., "Facile crack-healing in organic-inorganic halide perovskite thin films." *Acta Mater.* 187, 112-121 (2020)). Enhancing the mechanical reliability of PSCs is particularly challenging because the low formation energies of MHPs result in inherently poor mechanical properties, in that they are compliant (low Young's modulus, E), soft (low hardness, H), and brittle (low toughness, $G_C$) (see Ramirez et al.). For example, the prototypical MHP, methylammonium lead triiodide ($CH_3NH_3PbI_3$ or $MAPbI_3$), has E~17.8 GPa. H~0.6 GPa, and Gc~2.7 $J.m^{-2}$ (cohesion) as measured by nanoindentation of single-crystals (see Ramirez et al.). Furthermore, interfaces between the MHP thin film and the adjacent functional layers in planar PSCs multilayer stack are even more brittle, with $G_C<1.5$ $J.m^{-2}$ (adhesion) (see Rolston et al. (2016); Rolston et al. (2018); Dai et al., "Effect of grain size on the fracture behavior of organic-inorganic halide perovskite thin films for solar cells," *Scripta Mater.* 185, 47-50 (2020); Gutwald et al., "Perspectives on intrinsic toughening strategies and passivation of perovskite films with organic additives." *Solar Energy Mater. Solar Cells* 209, 110433 (2020)), making them prone to premature delamination.

The sources of internal and external mechanical stresses in PSCs that can drive fracture include (see Ramirez et al.; Yadavalli et al.): (i) coefficient of thermal expansion (CTE) mismatch between the layers; (ii) in-service thermal excursions; (iii) in-service damage-accumulation; and (iv) deformation during manufacturing, installation, maintenance, and service (such as bending, stretching, and twisting). In tandem PVs incorporating PSCs the CTE-induced internal stresses are expected to be even higher due to the additional layers, and in the case of flexible single-junction PSCs, the externally applied stresses are typically more severe (see Ramirez et al.; Yadavalli et al.). Although the ultimate in-service delamination failure of devices depends on many factors. Ge of the weakest interface—akin to the weakest link in a chain—is perhaps the most important metric that determines the mechanical reliability of multilayer devices (see Kim et al., "Understanding mechanical behavior and reliability of organic electronic materials." *MRS Bull.* 42. 115-123 (2017)).

There have been a few attempts to enhance the $G_C$ of the weakest interface in PSCs, with varying degrees of success, using approaches such as adding interfacial layers (see Rolston et al. (2018); Yun et al., "Synergistic enhancement and mechanism study of mechanical and moisture stability of perovskite solar cells introducing polyethylene-imine into the $CH_3NH_3PbI_3$/HTM interface," *J. Mater. Chem. A* 3, 2176-2182 (2015); Watson et al., "Cross-linkable, solvent-resistant fullerene contacts for robust and efficient perovskite solar cells with increased $J_{SC}$ and $V_{OC}$," *ACS Appl. Mater. Interf.* 8, 25896-25904 (2016); Jeong et al., "An interlocking fibrillar polymer layer for mechanical stability of perovskite solar cells," *Adv. Mater. Interf.* 7, 20001425 (2020); Song et al., "Selective defect passivation and topographical control of 4-dimethylaminopyridine at grain boundary for efficient and stable planar perovskite solar cells," *Adv. Energy Mater.* 11. 2003382 (2021)), scaffolding (see Watson et al., "Scaffold-reinforced perovskite compound solar cells," *Energy Environ. Sci.* 10, 2500-2508 (2017)), interpenetrating interfaces (see Dong et al., "Interpenetrating interfaces for efficient perovskite solar cells with high operational stability and mechanical robustness." *Nat. Commun.* 12, 973 (2021)), introducing additives (see Gutwald et al.; Tong et al., "High-performance methylammonium-free ideal-band-gap perovskite solar cells." *Matter*, in press (2021). doi: 10.1016/j.matt.2021.01.003), and grain coarsening (see Dai et al.). SAMs have been used to toughen interfaces in other types of devices while improving other functional properties. e.g. thermal conductivity (see O'Brien et al., "Bonding-induced thermal conductance enhancement at inorganic heterointerfaces using nanomolecular monolayers," *Nat. Mater.* 12, 118-122 (2013)). There remains a need for improved stability and performance of metal halide perovskite solar cells.

SUMMARY

Embodiments of the present disclosure relate in general to metal halide perovskite ("MHP") solar cells including several layers, such as with a laminated structure, including one or more self-assembled monolayers between one or more of the layers of a MHP solar cell. The disclosure provides a method of bonding an n-type oxide layer to an MHP layer using a self-assembled monolayer. The disclosure provides a method of bonding a p-type oxide layer to an MHP layer using a self-assembled monolayer. According to certain aspects, the self-assembled monolayer bonds the MHP layer to either the n-type oxide layer or the p-type oxide layer or both. According to one aspect, a self-assembled monolayer can be positioned in between, i.e. sandwiched between, one or more layers, two or more layers, three or more layers or between a plurality of layers making up the MHP solar cell laminate structure.

Perovskite ("MHP") solar cells typically contain several layers, including transparent substrate, transparent-conducting oxide (TCO) bottom electrode, electron-transport layer (n-type ETL), mesoscopic oxide/perovskite composite layer (optional), planar perovskite layer, hole-transport layer (p-type HTL), and top metal electrode. Typically, the ETL and the mesoscopic oxide is an n-type oxide ($TiO_2$ or $ZnO$ or $SnO_2$ or similar). Thus, typically the HTL includes $NiO_x$ where X is 0.8 to 1.2 or similar oxides or p-type polymers (e.g. PTAA) or organic molecules (e.g. spiro-OMeTAD). Methods of depositing or creating the various layers of a perovskite solar cell are known in the art such as vapor deposition, spin coating, dip coating, etc. In the case of inverted perovskite solar cells, an organic HTL (e.g. PEDOT:PSS) is typically used on the TCO-coated glass substrate. This is then coated with a planar perovskite layer, followed by an organic ETL (e.g. PCBM), and a metal electrode layer.

According to one aspect, a laminated structure is prepared by providing a first substrate having a n-type oxide layer on a first surface thereof, depositing a self-assembled mono-layer ("SAM") on the surface of the n-type oxide layer and then depositing a perovskite-containing layer on the self-assembled monolayer. According to an additional aspect, a self-assembled monolayer can be deposited on the perovskite-containing layer, and then a p-type HTL layer can be deposited on the self-assembled monolayer. In this manner, a laminate structure is created with two self-assembled monolayers contacting either side of the perovskite-containing layer of the solar cell.

According to one aspect, the self-assembled monolayers are formed by a monomer having a moiety that chemically reacts with the n-type ETL oxide layer or p-type HTL layer to form a chemical bond. The monomer also includes a moiety that interacts with the MHP layer to strengthen the interaction between the SAM and the MHP layer. When present between an ETL and MHP layer, the SAM strengthens the bond between the ETL and the MHP layer. When present between an HTL and MHP layer, the SAM strengthens the bond between the HTL and the MHP layer. In this manner, the self-assembled monolayer inhibits delamination of the MHP layer from the n-type ETL oxide layer or the p-type HTL layer. According to one aspect, self-assembled monolayers as described herein enhance simultaneously interfacial toughness, performance, operational stability, and reliability of perovskite solar cells.

According to one aspect, the normally brittle interface between the MHP thin film and the underlying $SnO_2$ electron-transport layer (ETL) is strengthened to inhibit delamination using a halide-terminated self-assembled monolayer, such as an iodine-terminated self-assembled monolayer ("I-SAM") that acts as a "molecular glue" to bond the MHP thin film to the ETL. The used of a halide terminated self-assembled monolayer improves bonding between the ETL layer and the MHP layer which also increases PCE, reduces hysteresis and increases operational stability compared to an ETL and MHP laminate without the SAM. According to one aspect, the halide-SAM improved mechanical integrity of the ETL/MHP interface with increased operational stability of the perovskite solar cell ("PSC"). The same approach using a halide-SAM is applied to the HTL and MHP layer to improve bonding between the HTL and the MHP layer resulting in increased PCE. reduced hysteresis and increased operational stability.

Further features and advantages of certain embodiments of the present disclosure will become more fully apparent in the following description of the embodiments and drawings thereof, and from the claims.

BRIEF DESCRIPTION OF THE DRAWINGS

The foregoing and other features and advantages of the present invention will be more fully understood from the following detailed description of illustrative embodiments taken in conjunction with the accompanying drawings in which.

TABLE 1

Figure 2:
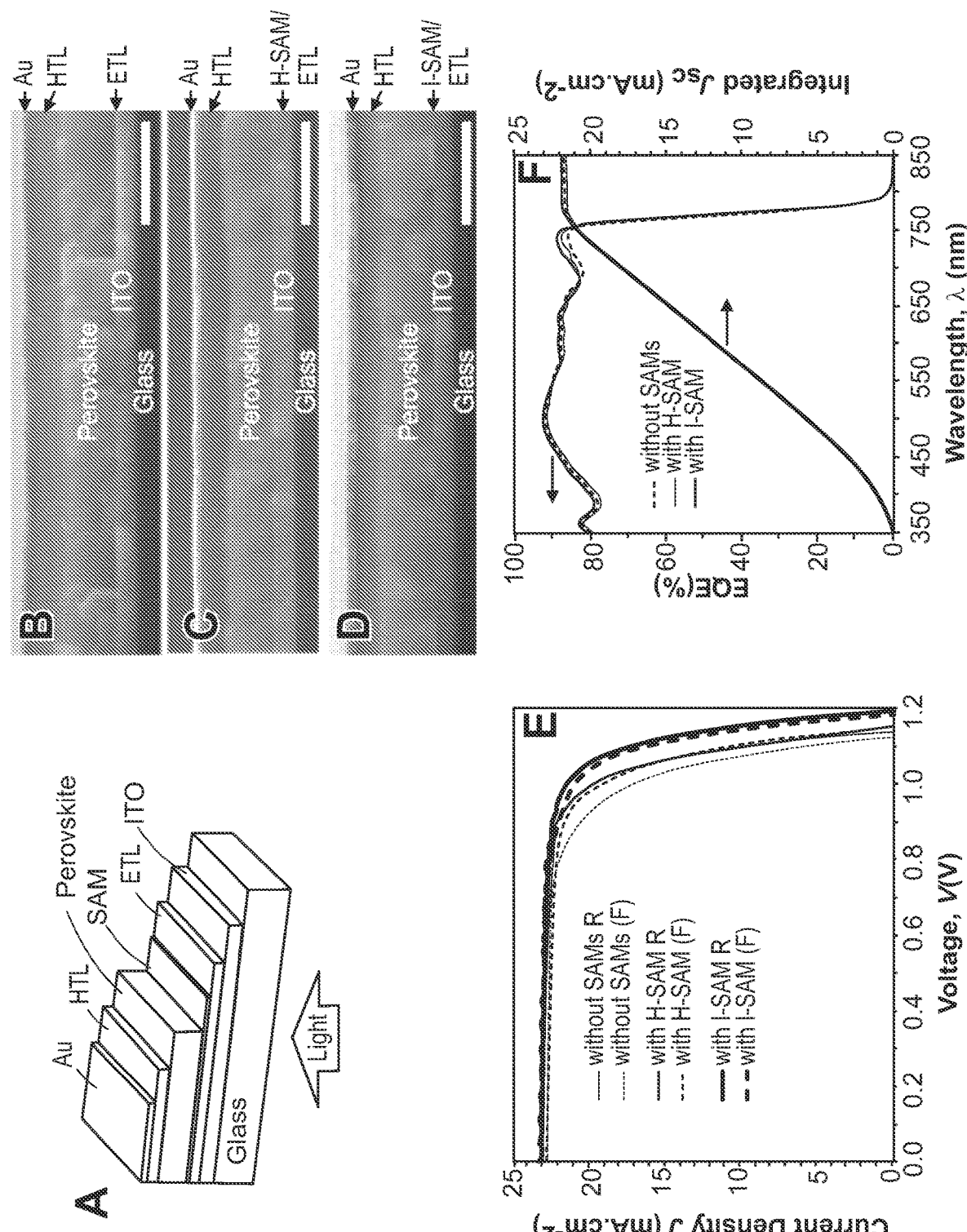
FIG. 2. Structure and performance of PSCs. (A) Schematic illustration (not to scale) of the n-i-p "regular" planar PSC with SAM between the ETL and the perovskite layer (SAMs absent in control PSC). A SAM can also be placed between the perovskite later and the HTL layer. Cross-sectional SEM images of as-fabricated PSCs (scale bar=1 μm): (B) without SAMs, (C) with H-SAM, and (D) with I-SAM. (E) J-V responses, in reverse (R) and forward (F) scans, of "champion" PSCs without SAMs, and ones with H-SAM or I-SAM. (See Table 1 for PV performance parameters.) (F) EQE spectra and integrated $J_{SC}$ of the "champion" PSCs without SAMs, and ones with H-SAM or I-SAM.

| PV performance parameters extracted from the J-V data, in reverse (R) and forward (F) scans, in FIG. 2E of "champion" PSCs without SAMs, and ones with H-SAM or I-SAM. | | | | | |
| --- | --- | --- | --- | --- | --- |
| PSC | Scan | $V_{OC}$ (V) | $J_{SC}$ (mA · cm$^{-2}$) | FF | PCE (%) |
| without | R | 1.131 | 23.02 | 0.774 | 20.15 |
| SAMs | F | 1.117 | 22.99 | 0.721 | 18.52 |
| with | R | 1.143 | 23.18 | 0.762 | 20.19 |
| H-SAM | F | 1.142 | 22.86 | 0.760 | 19.84 |
| with | R | 1.185 | 23.26 | 0.778 | 21.44 |
| I-SAM | F | 1.182 | 23.22 | 0.759 | 20.83 |

Figure 3:
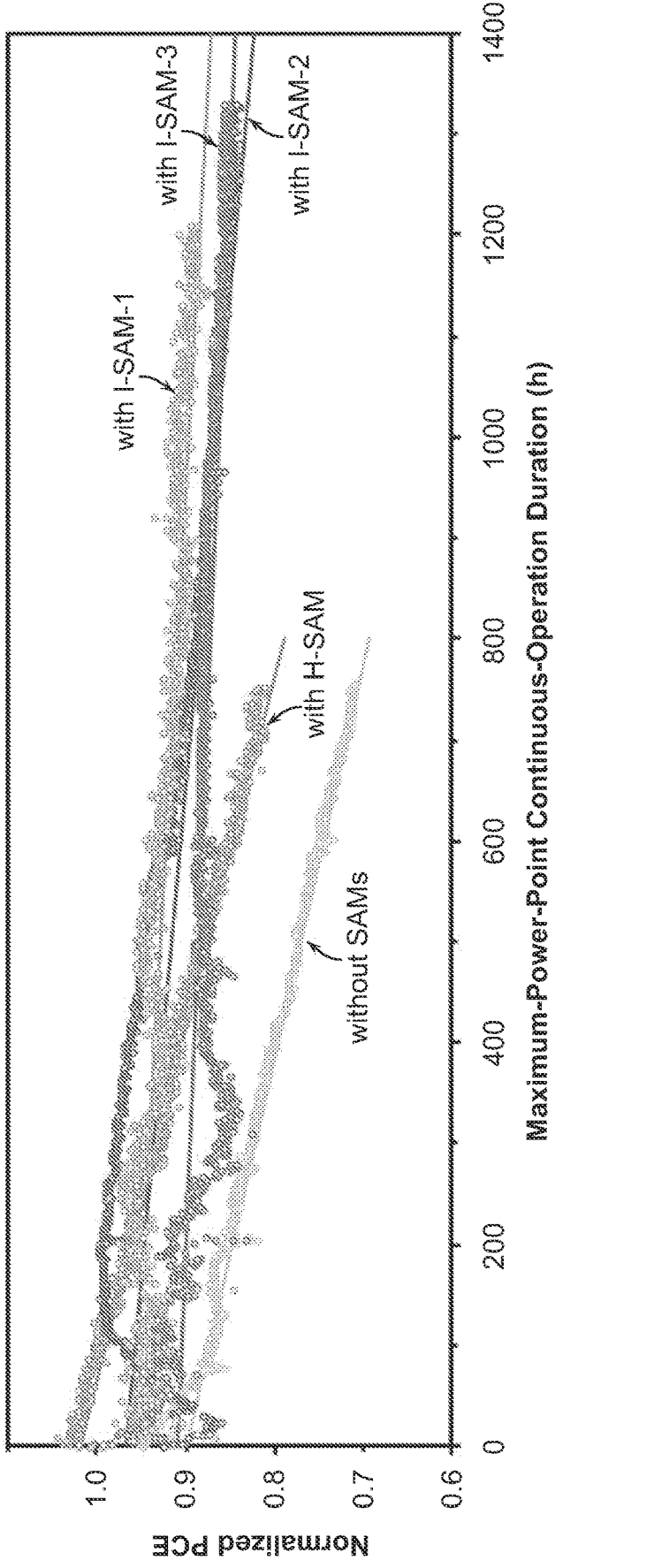

FIG. 3. Normalized PCE of PSCs with SAMs, and ones with H-SAM or I-SAM (three devices) as a function of time under the following conditions: 1-sun continuous illumination, MPP-tracking, unencapsulated, flowing $N_2$ atmosphere, and room-temperature. PCE recorded approximately every hour. The lines are linear fits to the data after initial "burn-in" and non-monotonic behavior, where the y-intercept and the slope are used to estimate/project the T80 duration.

Figure 4:
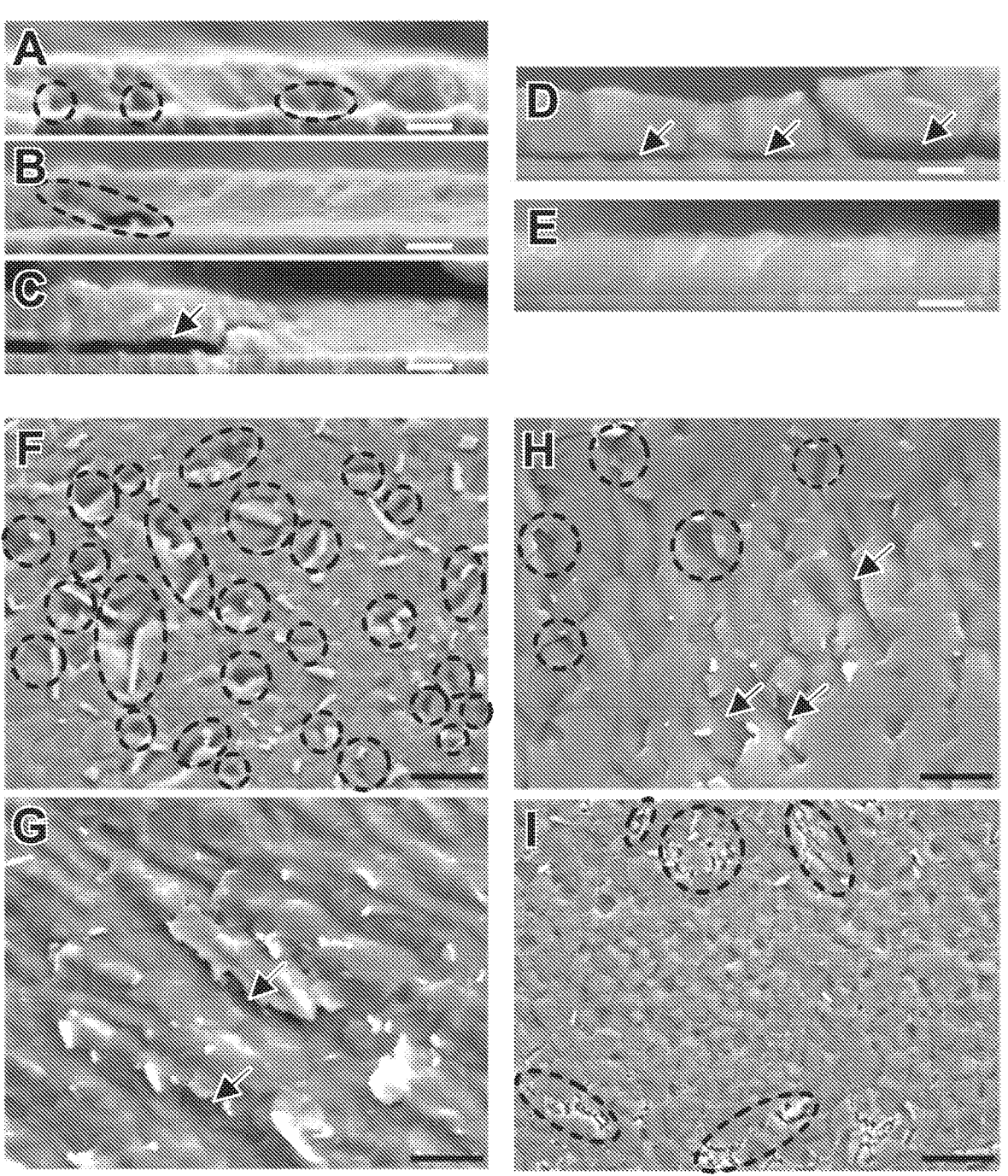

FIG. 4. Characterization of operational-stability-tested PSCs. (A-C) Cross-sectional SEM images of the PSC without SAMs tested for 757 h showing morphological degradation at the ETL/MHP interface: (A) small voids (dashed circles/ovals), (B) large voids (dashed oval), and (C) delamination (arrow). (D) Cross-sectional SEM image of the PSC with H-SAM tested for 754 h showing delamination (arrows). (E) Cross-sectional SEM image of a PSC with I-SAM tested for 1,331 h with intact ETL/MHP interface demonstrating that the presence of the I-SAM bonding between the ETL and the perovskite layer inhibited delamination between the layers and improved mechanical and structural integrity of the PSC. (F-G) SEM images of fracture surface (perovskite bottom side) of the PSC without SAMs showing: (F) small and large voids (dashed circles/ovals) and (G) interfacial delamination (arrows). (H) Corresponding SEM image of the PSC with H-SAM showing voids (dashed circles/ovals) and delamination (arrows). (I) Corresponding SEM image of the PSC with I-SAM showing minimal morphological degradation (dashed circles/ovals). Scale bars: (A-E)=0.5 μm; (F-I)=1 μm.

Figure 5:
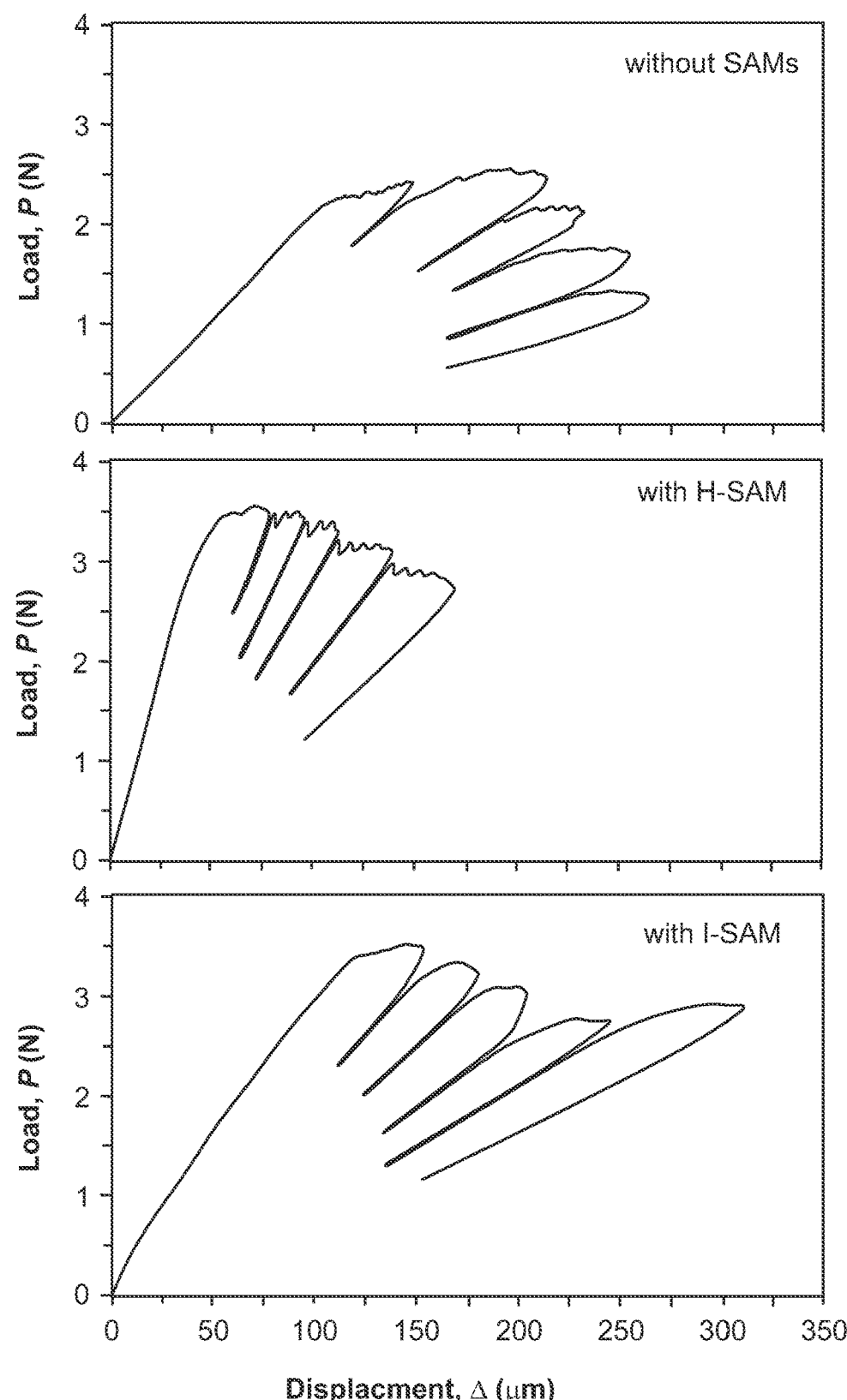

FIG. 5. Representative P-Δ loading-unloading curves for the measurement of $G_C$ of the "sandwich" DCB specimens: (A) without SAMs, (B) with H-SAM, and (C) with I-SAM.

Figure 6:
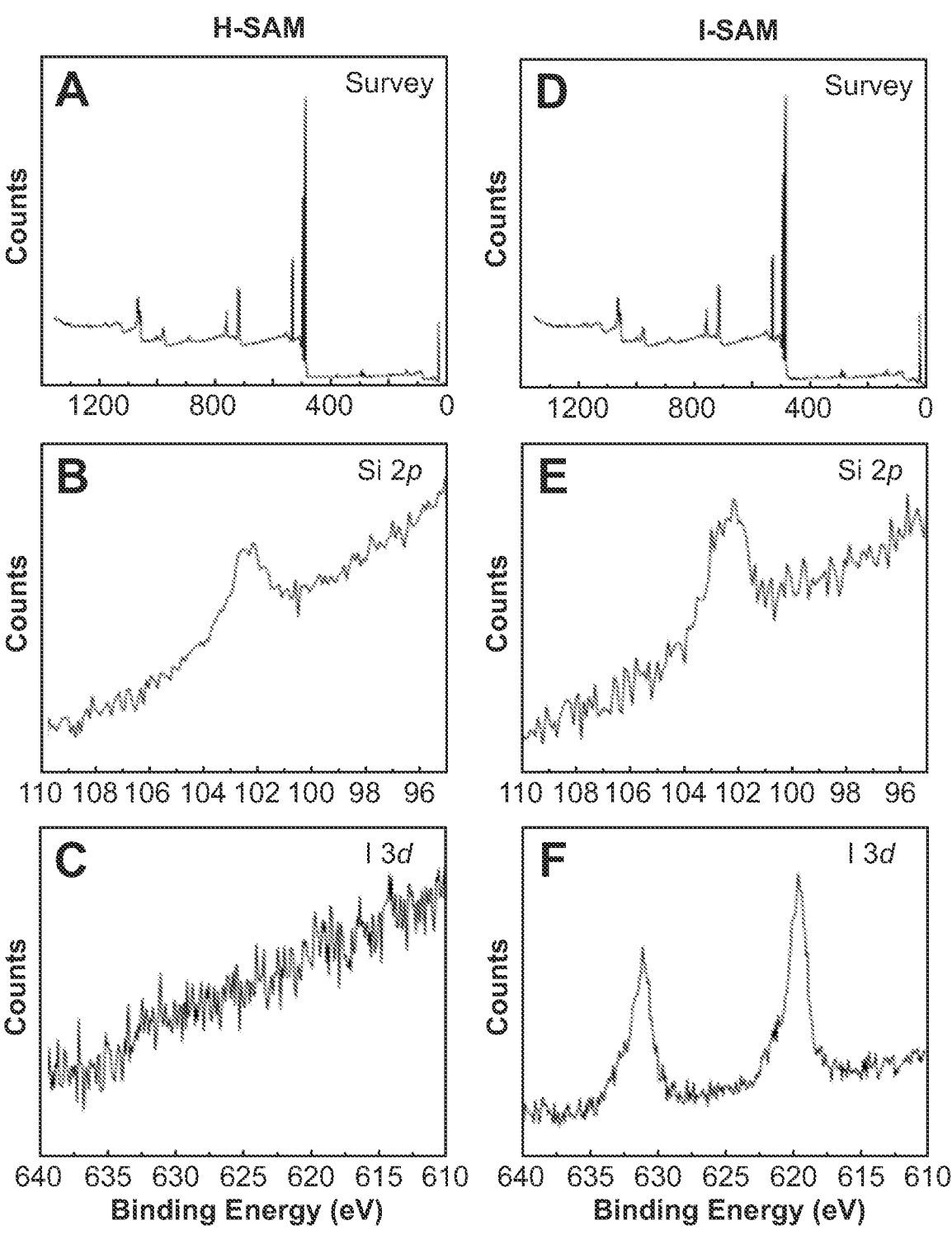

FIG. 6. XPS spectra from top-surface of $SnO_2$ ETL with SAMs deposited: (A) survey (with H-SAM), (B) Si 2p core level (with H-SAM), (C) I 3d core level (with H-SAM), (D) survey (with I-SAM), (E) Si 2p core level (with I-SAM), and (F) I 3d core level (with I-SAM).

Figure 7:
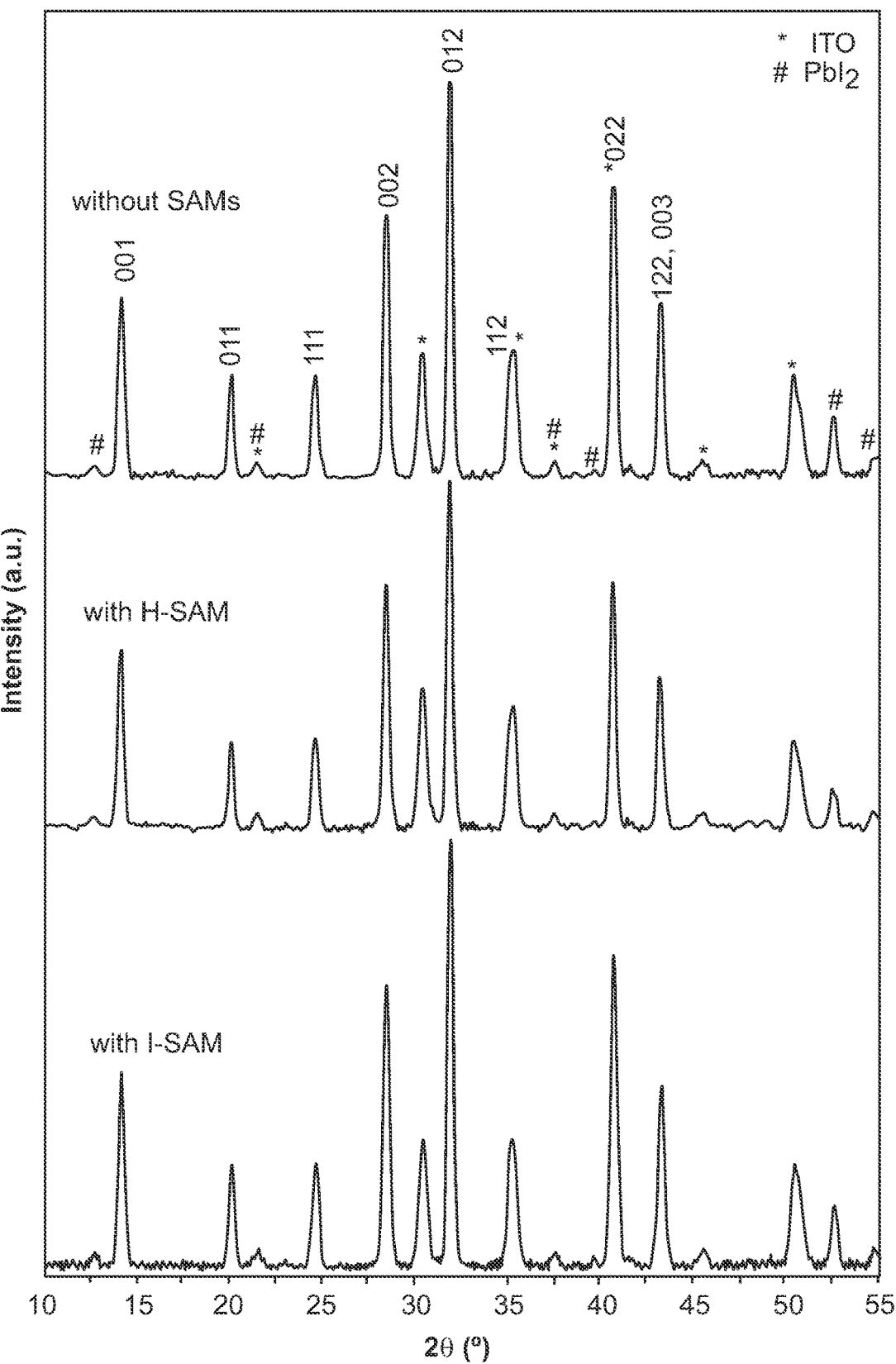

FIG. 7. Indexed XRD patterns from top-surfaces of the MHP thin films deposited on $SnO_2$ ETL without SAMs, with H-SAM, and with I-SAM. ITO substrate (*) and $PbI_2$ (#) peaks are marked.

Figure 8:
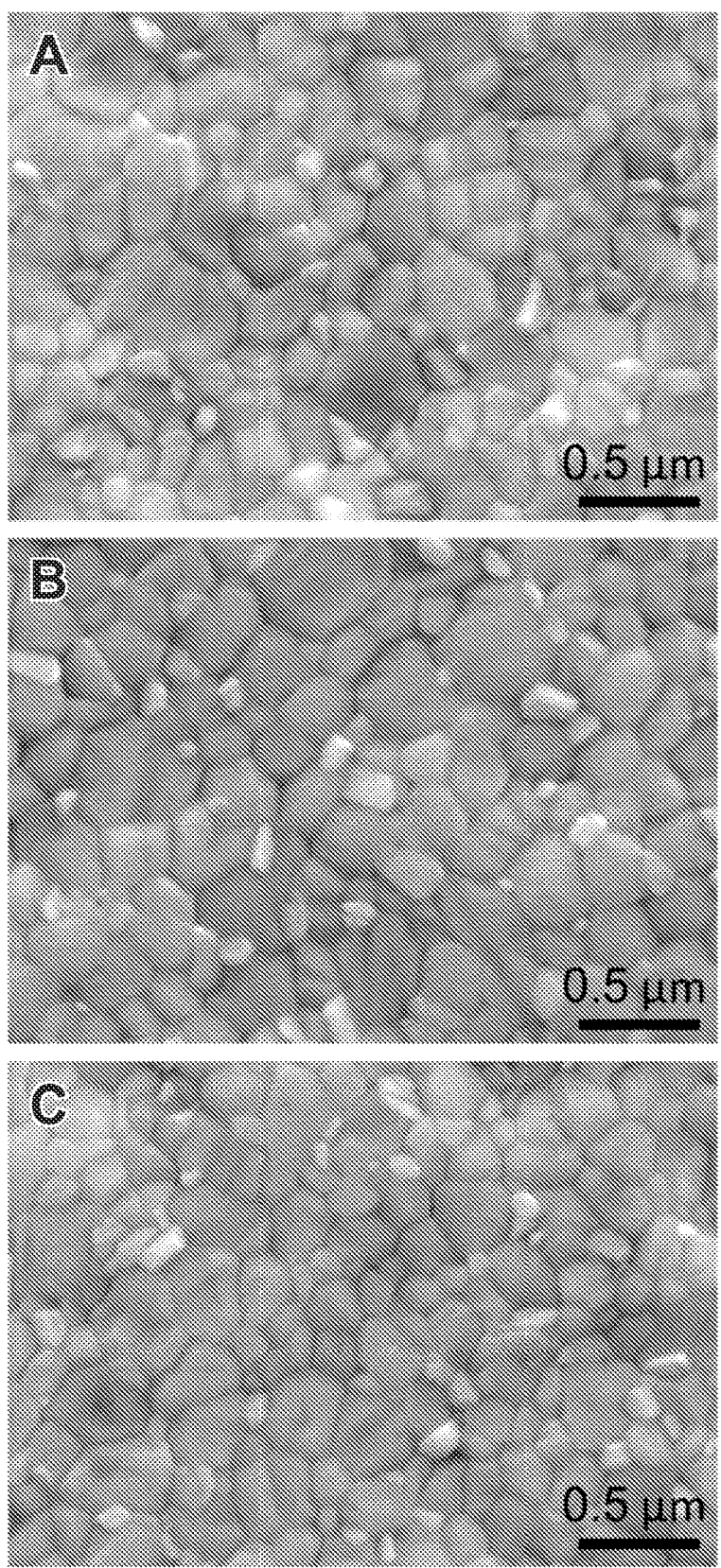

FIG. 8. Top-surface SEM micrographs of MHP thin films deposited on $SnO_2$ ETL: (A) without SAMs, (B) with H-SAM, and (C) with I-SAM underneath.

Figure 9:
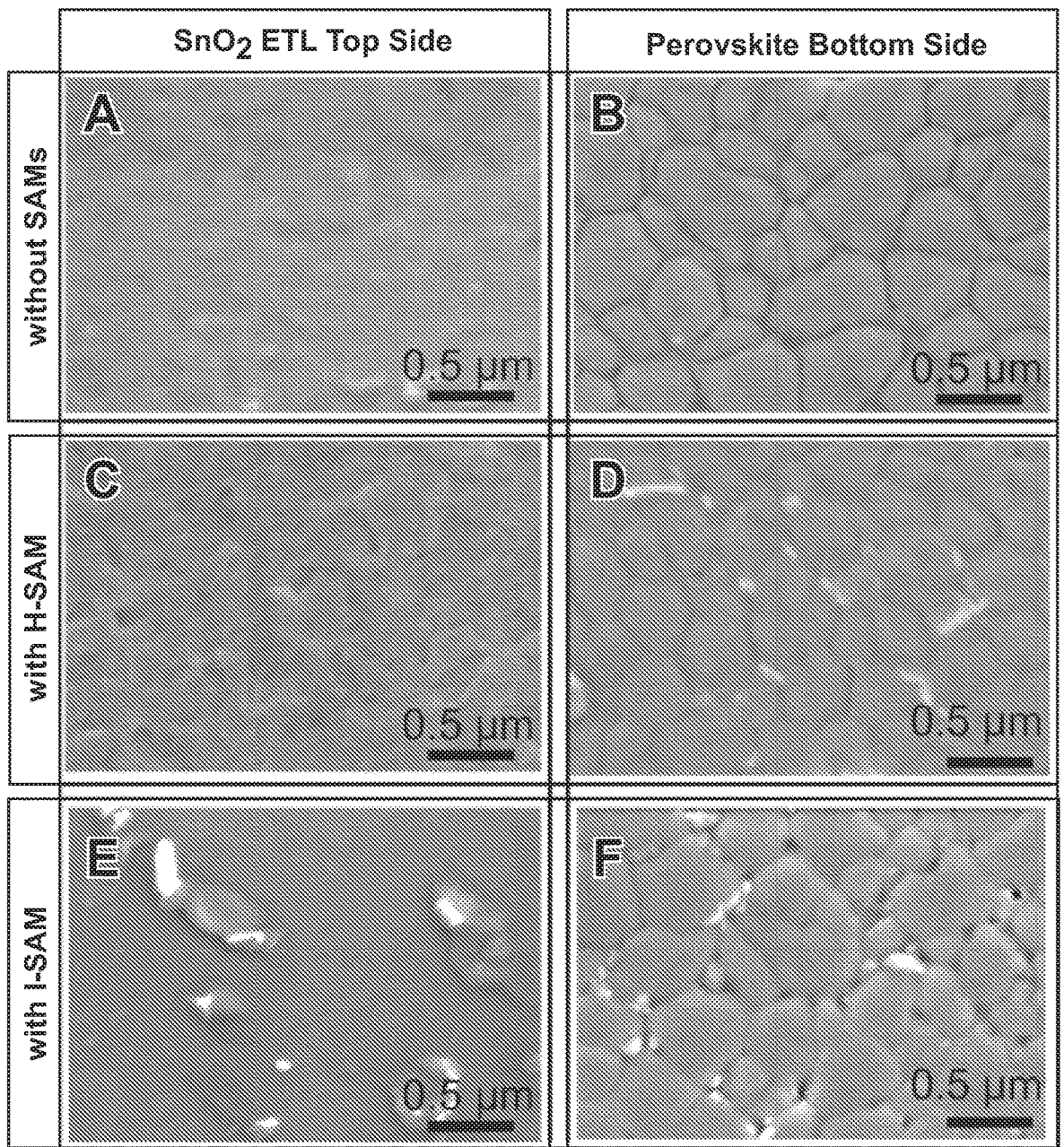

FIG. 9. SEM images of delaminated fracture surfaces: (A) without SAMs ($SnO_2$ ETL top side), (B) without SAMs (perovskite bottom side); (C) with H-SAM ($SnO_2$ ETL top side), (D) with H-SAM (perovskite bottom side); and (E) with I-SAM ($SnO_2$ ETL top side), and (F) with I-SAM (perovskite bottom side).

Figure 10:
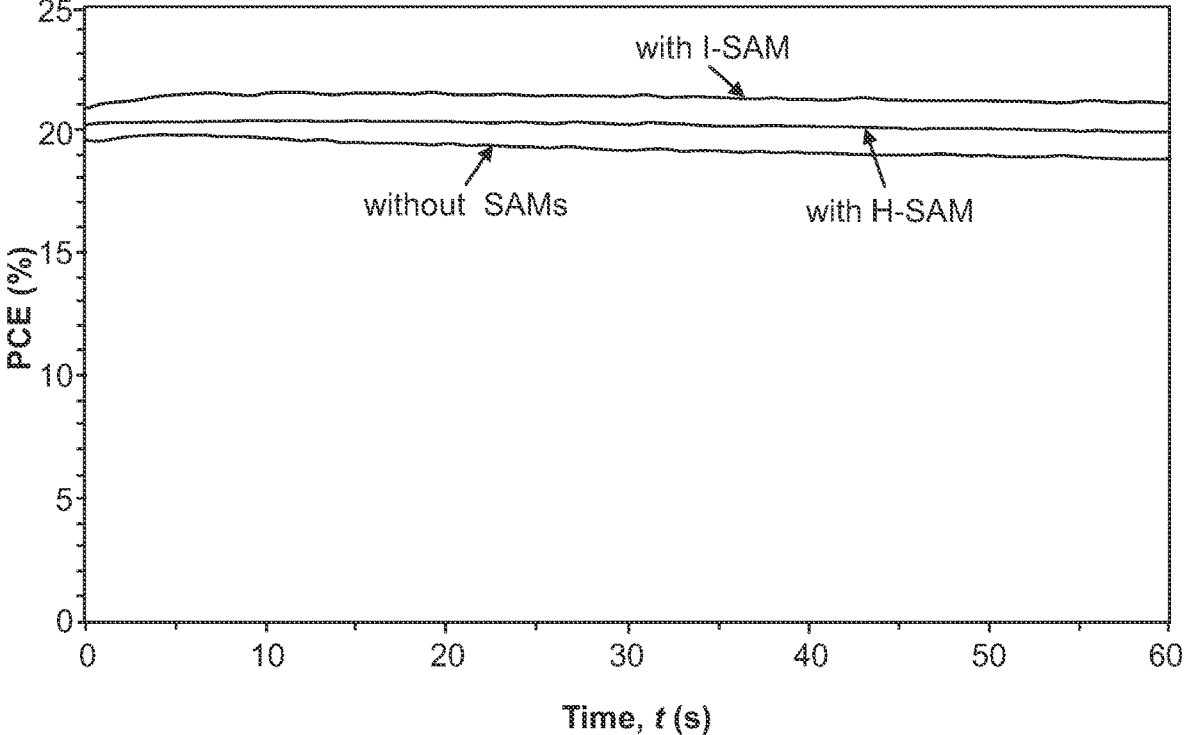

FIG. 10. Stabilized PCE outputs at MPP of "champion" PSCs: without SAMs (0.95 V bias), with H-SAM (0.95 V bias), and with I-SAM (1.0 V bias).

Figure 11:
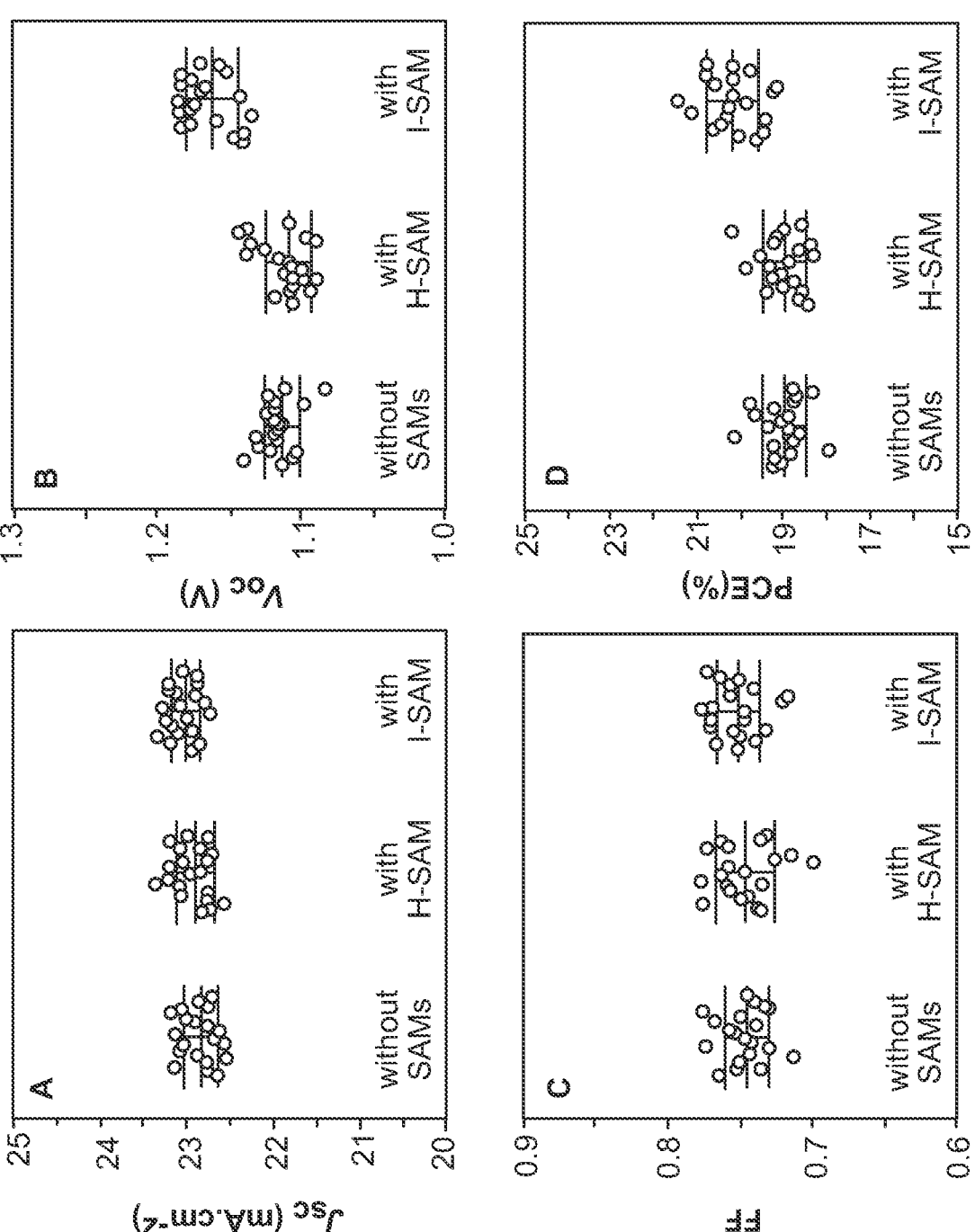

FIG. 11. PV performance parameters from J-V characteristics measured in reverse (R) scan of 20 each PSCs without SAMs, with H-SAM, and with I-SAM: (A) $J_{SC}$, (B) $V_{OC}$, (C) FF, and (D) PCE. Average±standard deviation indicated.

Figure 12:
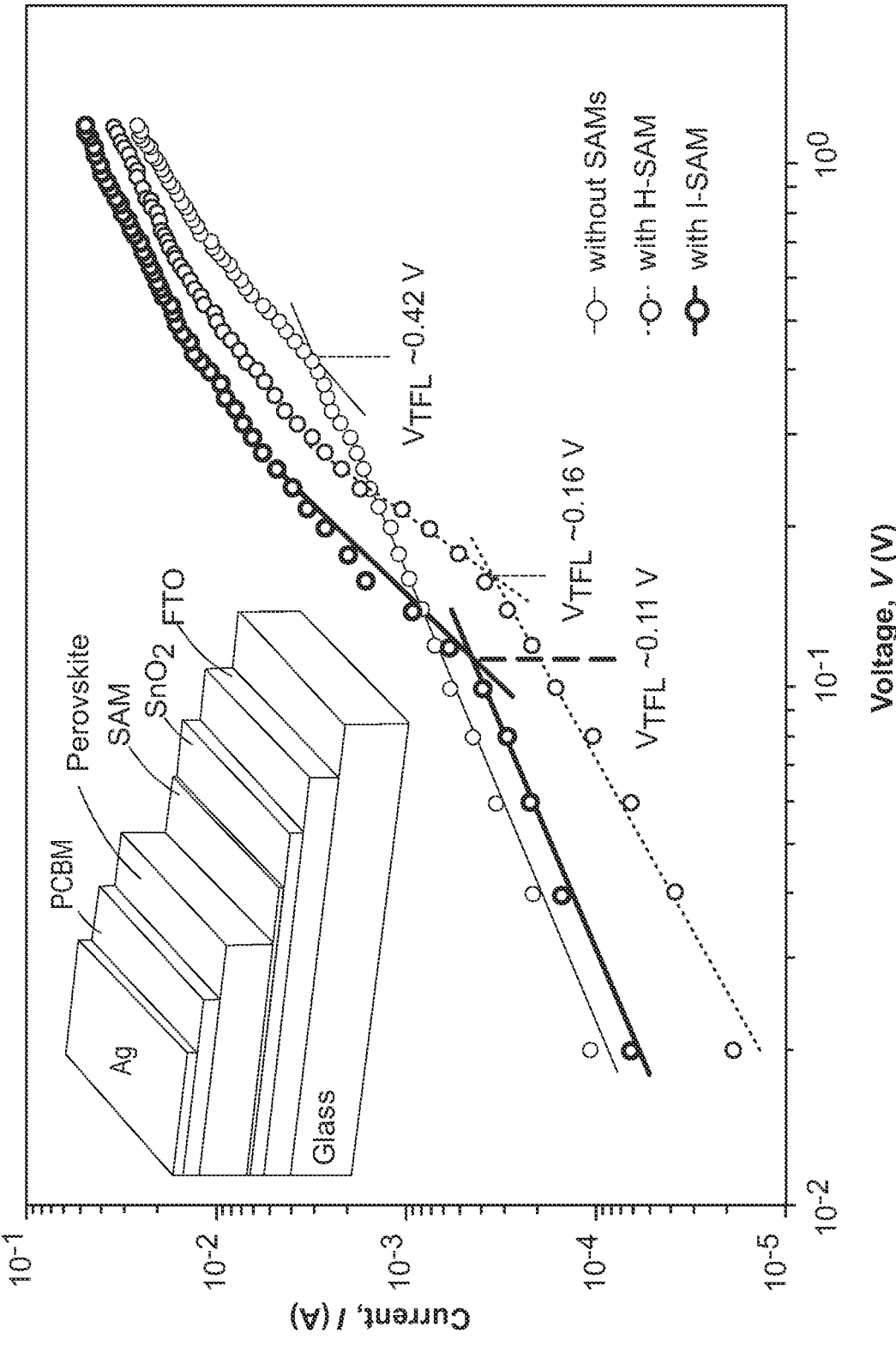

FIG. 12. I-V responses from electron-only transport devices (inset: schematic (not to scale)) without SAMs, with H-SAM, and with I-SAM, where the $V_{TFL}$ values are estimated at 0.42 V, 0.16 V. and 0.11 V, respectively. These values are used to estimate the trap densities ($n_{Trap}$) using Eqn. S3.

Figure 13:
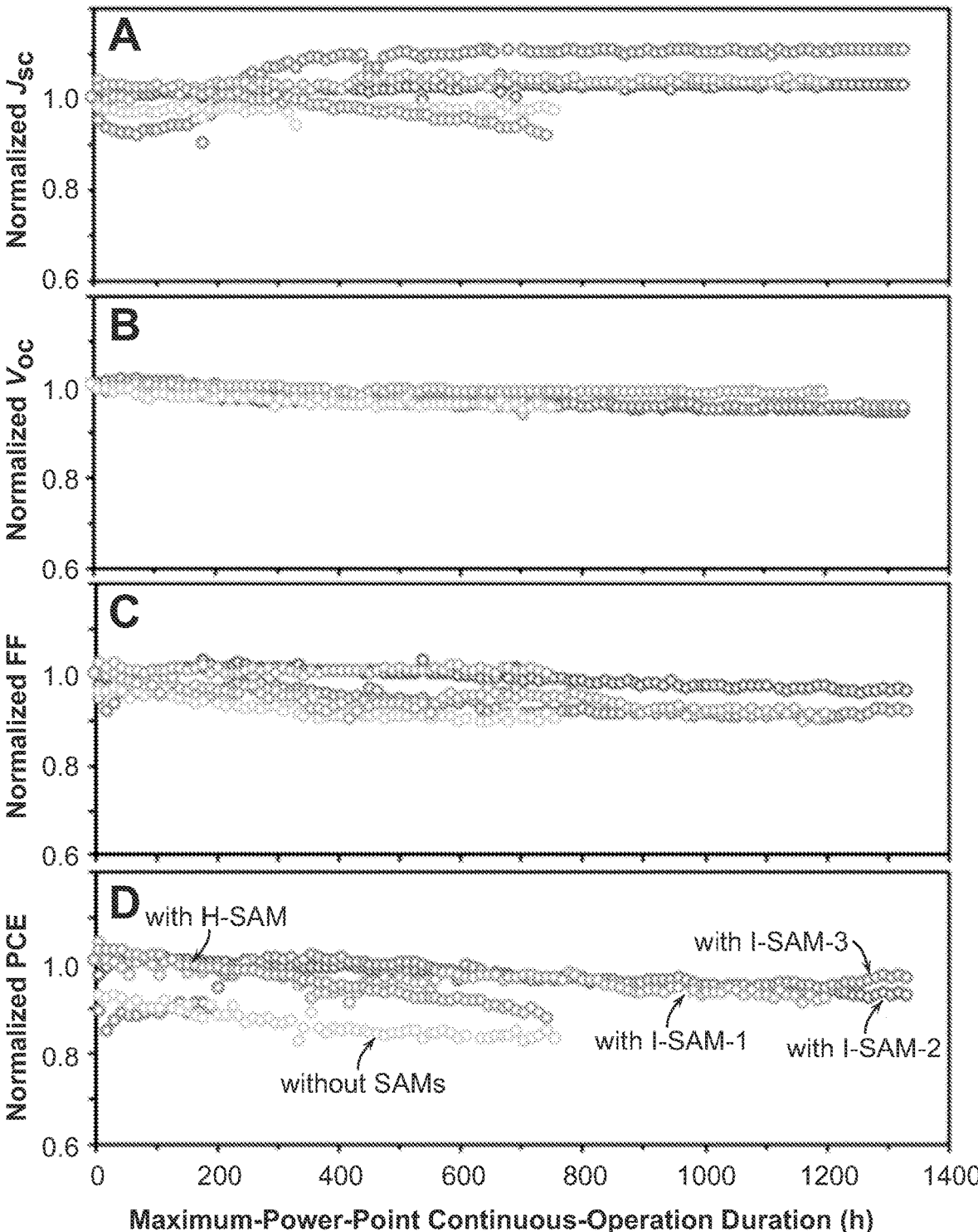

FIG. 13. Normalized PV parameters from J-V responses (recorded approximately every 12 h) as a function of time during operational-stability testing of PSCs without SAMs, with H-SAM, and with I-SAM (three devices): (A) $J_{SC}$, (B) $V_{OC}$, (C) FF, and (D) PCE. Operational-stability testing conditions: 1-sun continuous illumination, MPP-tracking, unencapsulated, flowing $N_2$ atmosphere, and room temperature. Note that PCE from the J-V response is typically higher than that measured during MPP tracking (see Khenkin et al., "Consensus statement for stability assessment and reporting for perovskite photovoltaics based on ISOS procedures," *Nat. Energy* 5, 35-49 (2020); Saliba et al., "Measuring aging stability of perovskite solar cells," *Joule* 2, 1019-1027 (2018)).

TABLE 3

Initial 'before' PV parameters of the all the operational-stability-tested PSCs, and PV parameters of the PSCs with H-SAM and with I-SAM (three devices) at the end of operational-stability tests ('after'), derived from the J-V responses measured using the Keithley-Newport testing system.

| PSC | Duration (h) | $J_{SC}$ (mA · cm$^{-2}$) | $V_{OC}$ (V) | FF | PCE (%) |
|---|---|---|---|---|---|
| without SAMs* | 0 | 23.11 | 1.089 | 0.759 | 19.10 |
| with H-SAM | 0 | 23.07 | 1.105 | 0.746 | 19.02 |
| | 754** | 22.66 | 1.056 | 0.708 | 16.94 |
| with I-SAM-1 | 0 | 22.96 | 1.162 | 0.768 | 20.49 |
| | 1210* | 23.05 | 1.130 | 0.704 | 18.34 |
| with I-SAM-2 | 0 | 23.34 | 1.113 | 0.776 | 20.16 |
| | 1331** | 23.24 | 1.079 | 0.752 | 18.86 |
| with I-SAM-3 | 0 | 23.21 | 1.107 | 0.770 | 19.78 |
| | 1331** | 23.07 | 1.084 | 0.730 | 18.26 |

*The PV parameters of the control PSC could not be removed from the Candlelight testing system after operational-stability testing for 757 h, therefore, its 'after' PV parameters could not be determined using the Keithley-Newport testing system.
**The operational-stability-tested PSCs rested in dark in a glovebox prior to the measurement of the 'after' PV parameters.

Figure 14:
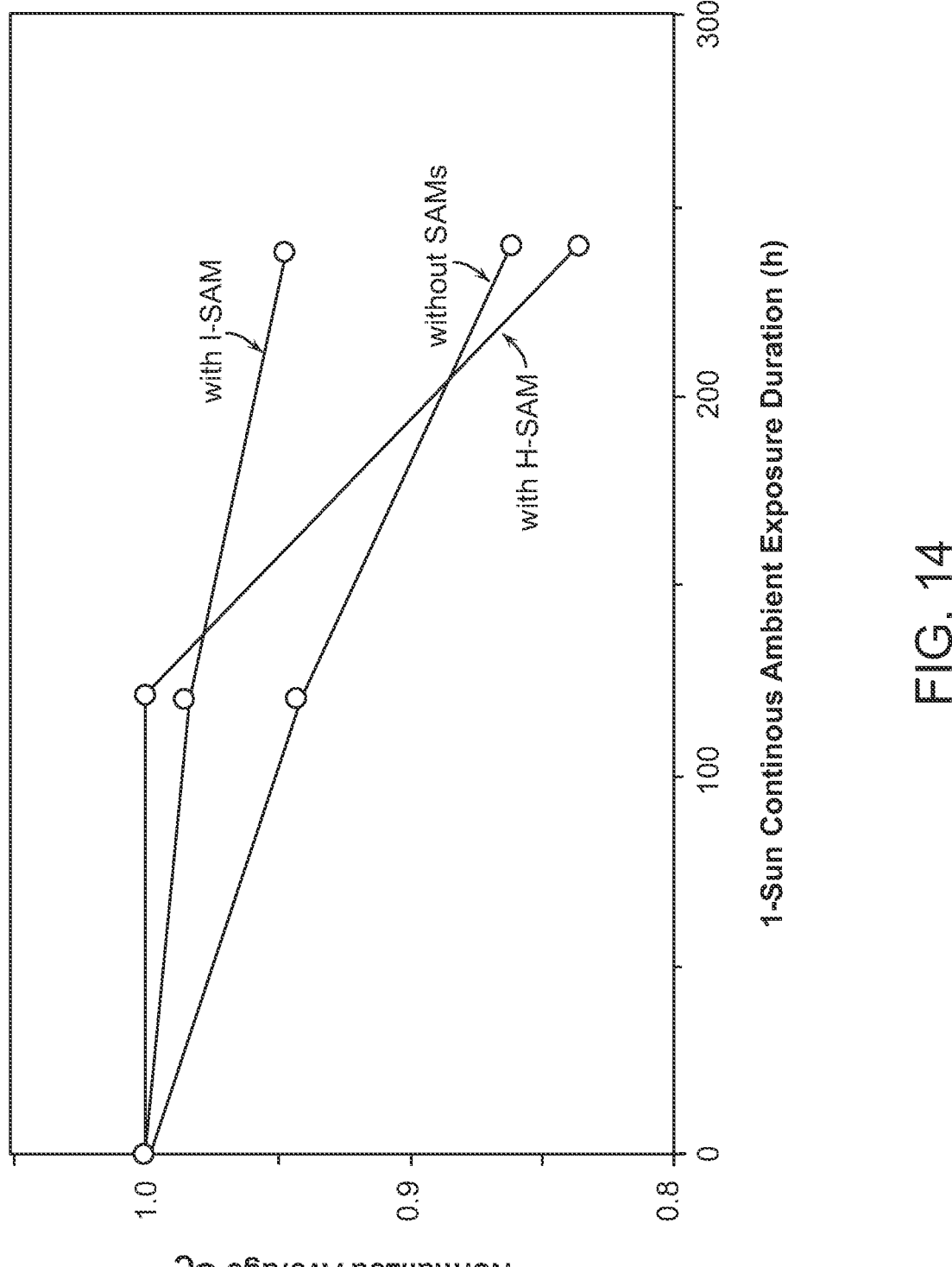

FIG. 14. Normalized average Ge as a function of continuous exposure to 1-sun (LED) before testing of "sandwich" DCB specimens (six each): without SAMs, with H-SAM, and with I-SAM. See Table 4 for $G_C$ values.

DETAILED DESCRIPTION

TABLE 4

Interfacial toughness ($G_C$) values of 6 specimens each of ETL/MHP interface without SAMs, with H-SAM, and with I-SAM measured using the DCB delamination method (FIG. 1A), subjected to continuous exposure to 1-sun white LED for 120 h or 240 h in the ambient (~35 ° C., ~40% RH).

| | without SAMs $G_C$ (J · m$^{-2}$) | | with H-SAM $G_C$ (J · m$^{-2}$) | | with I-SAM $G_C$ (J · m$^{-2}$) | |
|---|---|---|---|---|---|---|
| # | 120 h | 240 h | 120 h | 240 h | 120 h | 240 h |
| 1 | 1.77 | 1.88 | 1.98 | 1.35 | 3.07 | 3.06 |
| 2 | 1.52 | 2.07 | 1.56 | 1.43 | 3.11 | 2.69 |
| 3 | 2.07 | 1.37 | 1.64 | 1.87 | 2.46 | 2.76 |
| 4 | 2.28 | 1.50 | 2.24 | 1.46 | 3.02 | 2.08 |
| 5 | 1.54 | 1.72 | 1.94 | 0.62 | 2.78 | 2.99 |
| 6 | 1.61 | 1.33 | 0.98 | 1.89 | 2.26 | 2.48 |
| Avg. ± SD | 1.80 ± 0.28 | 1.65 ± 0.27 | 1.72 ± 0.40 | 1.44 ± 0.42 | 2.78 ± 0.32 | 2.68 ± 0.33 |

Aspects of the present disclosure are directed to providing a halide-terminated self-assembled monolayer ("halide-SAM") between an MHP layer and an adjacent layer such as a ETL or a HTL layer, such as within a perovskite solar cell ("PSC"). Perovskite solar cells are known within the art. The halide-SAM can also be located between one or more other layers of a PSC. The use of SAMs in general is exemplified in Ali, *Advanced Energy Materials* 10, 2002989 (2020), Kim, *Advanced Energy Materials* 10, 2002606 (2020), Choi, *Solar RRL* 4, 1900251 (2020), and Qiao, *J. Mater. Res., Vol.* 33, No. 4 (2018) the descriptions of SAMs of which are incorporated by reference herein.

Figure 1:
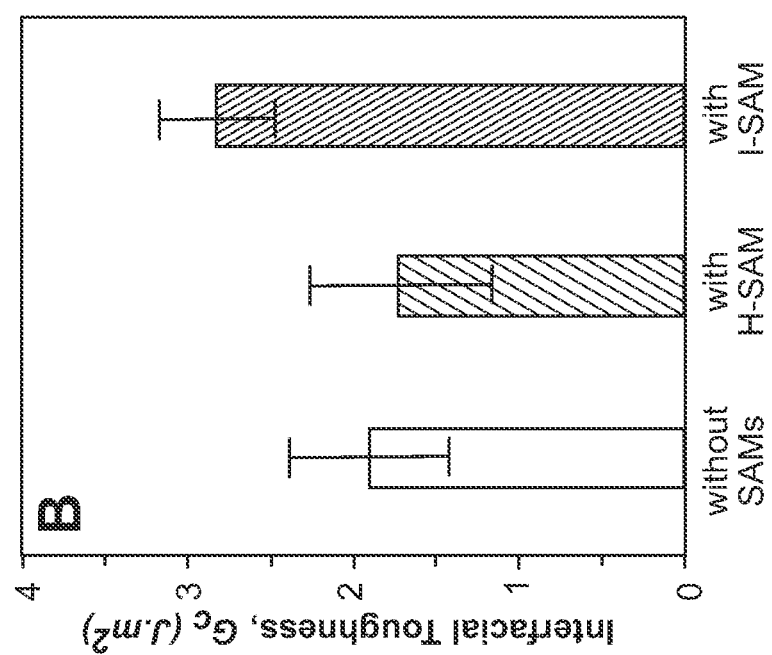
FIG. 1. Mechanical behavior of the ETL/MHP interface. (A) Schematic illustration of the "sandwich" DCB specimen for toughness testing (not to scale). Inset: magnified schematic illustration of an exemplary Iodide-SAM ("I-SAM") where iodide atom is attached to the terminal carbon of a $C_3$ alkyl carbon chain. (B) Toughness of ETL/MHP interface without SAMs, and ones with H-SAM or I-SAM. The histograms and error bars represent average and standard deviation, respectively, of 12 specimens each (see Table 2 for the data).
Figure 1:
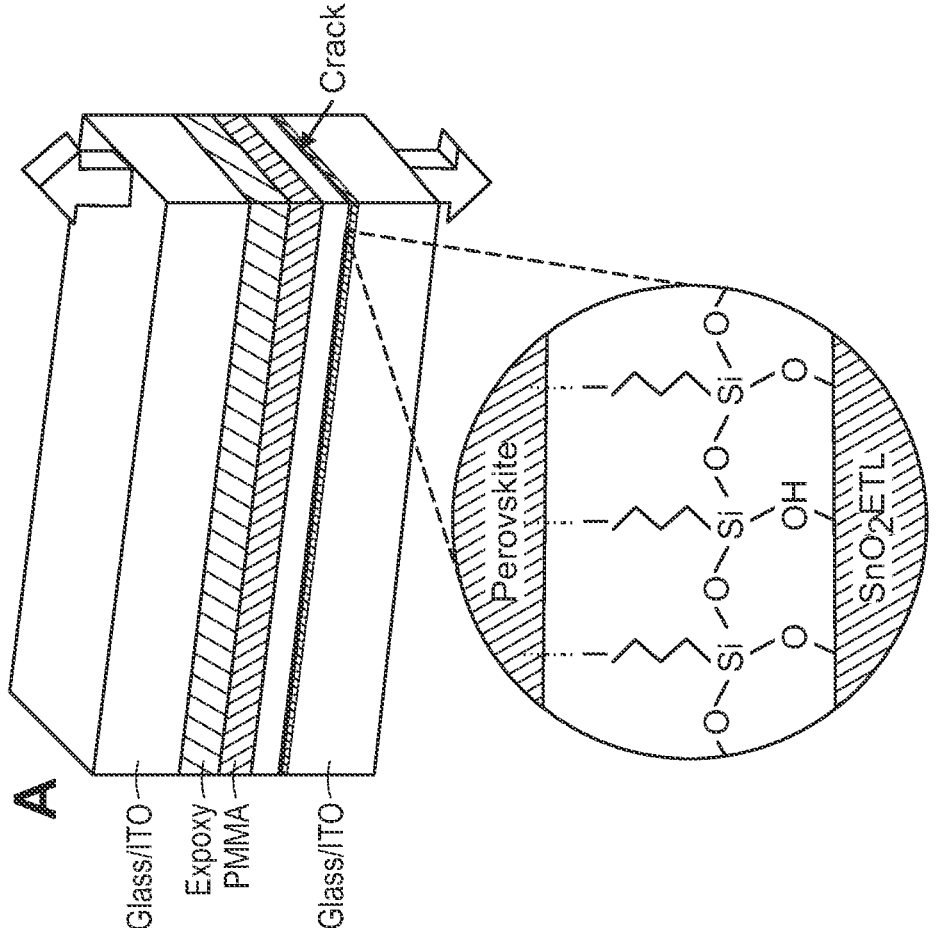

A typical SAMs molecule comprises an 'anchor' group, a 'linker', and a 'terminal' group (see FIG. 1A with respect to I being an exemplary terminal group, $C_3$ alkyl being an exemplary linker group and the anchor group derived from —$Si(OCH_3)_3$). It is to be understood that a self-assembled monolayer may be made up of a single species of monomer or a two or more species of monomer. In one embodiment, a single species of monomer is used which forms the self-assembled monolayer on the substrate surface with a plurality of monomers bonding to the substrate surface. It is to be understood that not all monomers of the self-assembled monolayer bond to the substrate surface as illustrated in FIG. 1A. Nevertheless, such monomers may be part of the self-assembled monolayer by bonding to other monomers. According to one aspect, the anchor group provides strong bonding to the surface of the substrate, the linker is an organic short-chain, and the terminal group that interacts with the MHP.

According to one aspect, the halide-SAMs include a halogen (e.g. Cl, Br, or I) group that interacts with the surface of the MHP layer via strong coordination bonding with $Pb^{2+}$ in the MHP. The anchor group (e.g. silane or Brønsted-Lowry acid) bonds to the ETL (metal-oxide) layer and/or the HTL (organic) layer. Accordingly, the halide-SAMs form a bond between the ETL and MHP layer and/or the HTL and perovskite layer. According to one aspect, the halide-SAMs provide increased mechanical stability, durability, reliability and enhanced performance.

According to one aspect, the halide-SAM includes a monomer of the following formula 1.

halide-(alkyl)-anchoring group        Formula 1

According to one aspect, halide is selected from chlorine, fluorine, bromine and iodine. According to one aspect, halide is covalently bonded to the terminal carbon of the alkyl. According to one aspect, the terminal carbon is —$CH_2$—. This provides a structure where steric hindrance between the halide and the surface structure of the MHP is reduced to improve interaction between the halide and the surface structure of the MHP. This design reducing steric hindrance and improving interaction between the halide and the MHP improves the strength of the coordination bond thereby improving the mechanical integrity between the MHP layer and the ETL or HTL layer.

According to one aspect, alkyl is an alkyl chain from 2 to 10 carbon atoms, such as a straight chain alkyl of from 2 to 10 carbon atoms. According to one aspect. alkyl is a straight chain alkyl from 2 to 5 carbon atoms or from 3 to 7 carbon atoms. This design further reduces steric hindrance between the the halide and the MHP insofar as the alkyl chain is able to extend out the halide atom with minimal steric hindrance to facilitate better interaction between the halide atom and the MHP surface, thereby improving the strength of the coordination bond thereby improving the mechanical integrity between the MHP layer and the ETL or HTL layer.

According to one aspect, the anchoring group is a moiety that covalently reacts with a corresponding functional group on the ETL or HTL layer to form a self-assembled monolayer. The anchoring group may also react or polymerize with itself, to form a self-assembled monolayer. As discussed above, a plurality of the anchoring group moiety may not bond to the substrate surface, but nevertheless, still functions as an anchoring group by bonding to other anchoring group moieties or between anchoring group moieties that are bonded to the substrate surface. In this manner the self-assembled monolayer is formed. The anchoring group modifies the electronic states and stabilizes the surface by chemically attaching to the surface atoms. Such interaction also determines the coverage ratio of SAMs along the surface. Various anchoring groups suitable to bond to a substrate include thiols, carbonyl acid, carboxylic acid, phosphonic acid (—$P(=O)(OH)_2$), boronic acid (—$B(OH)_2$), sulphonic acid (—$S(=O)(OH)_2$), diols, thiol, dithiol, phosphoric acid, or silane derivatives such as silyl trialkoxide (—$Si(OR_3)$, among others, and the type of interaction and binding energy will be driven by the chemical nature at the interface. An exemplary anchor group is a represented by —Si—$(X)_3$, where X is a halogen. —OR' and R' is $C_1$ to $C_{10}$ alkyl with methyl, ethyl, propyl or butyl being exemplary. An exemplary anchor group is —$Si(OCH_3)_3$. In silane and related derivatives [RSi—X3 (X=Cl, —OR)], three Si—X bonds are hydrolysed to form silanol (RSi—OH) and are then condensed on the surfaces with —OH groups. Adjacent silanols react with each other forming M—O—Si and Si—O—Si covalent bonds, respectively, to provide a cross-linked network covalently bonded anchor groups across the surface of the substrate, as is known in the art, for example, from Ali, *Advanced Energy Materials* 10, 2002989 (2020). Generally, the anchoring groups of SAMs used in PSCs have carboxyl, sulfonic, phosphonic, or silane groups because PSCs commonly use metal oxides (e.g., $TiO_2$, $SnO_2$, ZnO, or NiO), which have hydroxyl groups at the surface, as CTLs.

According to one aspect, exemplary halide-SAMs within the scope of the present disclosure include ($Si(OCH_3)_3$ $(CH_2)_3I$), ($Si(OCH_3)_3(CH_2)_3Br$), ($Si(OCH_3)_3(CH_2)_3Cl$), and ($Si(OCH_3)_3(CH_2)_3F$).

Perovskite solar cells may be manufactured using a variety of substrates known to those of skill in the art as being useful in the manufacture of solar cells. Substrates often include a polymer, glass, ceramic, metal, or combination thereof. Substrates may be of any three dimensional configuration as desired. In some aspects, a substrate has a planar configuration.

One suitable process for manufacturing a perovskite solar cell includes depositing a dense oxide electron-transport layer (ETL) onto a first surface of a substrate. The substrate may be, for example, a transparent-conducting oxide (TCO)-coated glass substrate. A variety of techniques may be used for depositing the ETL, such as solution processing or spray pyrolysis, e.g., at 300-500° C. The ETL may be, for example. $TiO_2$ or another suitable n-type oxide. The ETL typically has a thickness ranging from about 10 to about 30 nm.

Optionally, a mesoporous oxide layer is then deposited over the ETL. The mesoporous oxide layer may be applied using any suitable technique, such as by depositing oxide nanoparticles in the form of paste or colloidal solution, followed by a sintering heat-treatment, e.g., at a temperature of about 300 to about 500° C. The mesoporous oxide layer typically has a thickness ranging from about 50 to about 200 nm and may be $TiO_2$ or another suitable n-type oxide.

A metal halide perovskite MHP layer may then be deposited on the mesoporous oxide layer. A variety of techniques may be used to deposit the MHP layer, such as one-step or two-step solution-deposition methods or variations thereof, or a vapor-based method. The MHP layer typically has a thickness of about 200 to about 500 nm.

A hole-transport layer (p-type HTL) is deposited onto the MHP layer. The HTL may be depositing by any suitable technique, such as solution processing or spray pyrolysis, e.g., at a temperature of about 300 to about 500° C. The HTL may be, for example, $NiO_x$ or other p-type oxide as is known in the art. Typically the HTL has a thickness of about 10 to about 30 nm. Optionally, a mesoporous oxide layer is deposited over the HTL. The mesoporous oxide layer typically has a thickness ranging from about 50 to about 200 nm.

The mesoporous oxide layer may be applied via deposition of oxide ($NiO_x$ or other p-type oxide as is known in the art) nanoparticles (paste or colloidal solution), followed by sintering heat-treatment, e.g., at a temperature of about 300 to about 500° C.

A second (e.g., top) portion or suitable substrate of the solar cell is then contacted to the HTL or optional mesoporous oxide layer. The suitable substrate may be a metal having a work function $<\sim 5.2$ eV or a TCO-coated glass substrate.

In some aspects of the present disclosure, the MHP layer is a perovskite or a hybrid perovskite. Perovskites and hybrid perovskites and the three-dimensional or two-dimensional crystal structures they form are known to those of skill in the art and are extensively described in Cheng et al., *CrystEngComm*, 12, 2646-2662 (2010), hereby incorporated by reference in its entirety.

The halide may be an organometallic halide represented by the formula $RMe_nX_y$, wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, $CH_3NH_3$, $NH_3CH=CH_2$, Cs, $(R'—NH_3)_2$, $(NH_3—R'—NH_3)_2$ or $(R'—NH_3)_2R_{(n-1)}$; and R' is alkyl, $C_1$ to $C_4$ alkyl or $C_6H_5C_2H_4$; with the proviso that when y is 3, n is 1, Me is Pb, Sn, Ge, Eu or Yb and R is an organic group, $CH_3NH_3$ or $NH_3CH=CH_2$, or Cs, and further with the proviso that when y is (3n+1) and n is 1, Me is Cu, Co, Ni, Fe, Mn, Pd. Cd, Sn, Pb. Ge, Eu or Yb, and R is $(R'—NH_3)_2$ or $(NH_3—R'—NH_3)_2$ and further with the proviso that when y is (3n+1) and n is 2, 3, 4, or 5, Me is Cu, Co, Ni, Fe, Mn, Pd, Cd. Sn, Pb, Ge, Eu or Yb and R is $(R'—NH_3)_2R_{(n-1)}$.

Other examples of organometallic halides include compounds represented by the formula $RMeX_3$ wherein R is an organic group or Cs, Me is Pb, Sn, Ge, Eu or Yb and X is one or more of I, Br, Cl. According to one aspect, the organic group may be $CH_3NH_3$ or $NH_3CH=CH_2$.

In some examples, the organometallic halide is of the formula $CH_3NH_3PbX_3$, wherein X is one or more of Cl, Br, or I. For example, the organometallic halide may be $CH_3NH_3PbI_3$.

Yet other examples of organometallic halides include compounds represented by the formula $(R—NH_3)_2MeX_4$ wherein R is alkyl or $C_6H_5C_2H_4$, Me is a transition metal or a rare earth metal and X is one or more of Cl, Br, or I. According to one aspect. R is $C_1$ to $C_4$ alkyl or $C_6H_5C_2H_4$, Me is Cu, Co, Ni, Fe, Mn, Pd, Cd, Sn, Pb, Eu or Yb and X is one or more of Cl, Br, or I.

Organometallic halides also include compounds represented by the formula $(NH_3—R—NH_3)_2MeX_4$ wherein R is alkyl or $C_6H_5C_2H_4$. Me is a transition metal or a rare earth metal and X is one or more of Cl, Br, or I. According to one aspect, R is $C_1$ to $C_4$ alkyl or $C_6H_5C_2H_3$, Me is Cu, Co, Ni, Fe, Mn, Pd, Cd, Sn, Pb, Eu or Yb and X is one or more of Cl, Br, or I.

Other examples of organometallic halides include compounds represented by the formula $(R'NH_3)_2(R)_{(n-1)}Me_nX_{(3n+1)}$ wherein R' is $C_1$ to $C_4$ alkyl or $C_6H_5C_2H_4$, R is Cs, $CH_3NH_3$ or $NH_3CH=CH_2$, Me is Cu, Co, Ni, Fe, Mn, Pd, Cd, Sn, Pb, Eu or Yb, X is one or more of Cl, Br, or I and n is 2, 3, 4, or 5.

In other aspects of the present disclosure, the halide is of the formula $HMeX_3$, wherein Me is a transition metal or a rare earth metal and X is one or more of Cl, Br, or I. According to one aspect, Me is Cu, Co, Ni, Fe, Mn, Pd, Cd, Sn. Pb, Eu or Yb and X is one or more of Cl, Br, or I. Examples of such halides include $HPbX_3$, wherein X is one or more of Cl, Br, or I.

In yet other aspects, the halide is of the formula $NH_4MeX_3$, wherein Me is a transition metal or a rare earth metal and X is one or more of Cl, Br, or I. According to one aspect, Me is Cu, Co, Ni, Fe, Mn, Pd, Cd, Sn, Pb, Eu or Yb and X is one or more of Cl, Br, or I. Examples of such halides include $NH_4PbX_3$, wherein X is one or more of Cl, Br, or I.

In some aspects, the halide may be precipitated onto the surface of a substrate forming a coating on the substrate to result in a coated substrate at a temperature between about 10° C. and 70° C. between 10° C. and 50° C., between 20° C. and 30° C., or between 18° C. and 23° C. A solvent typically is used, such as a polar solvent having a boiling point within the range of 100° C. and 300° C. Non-limiting examples of suitable solvents include dimethylformamide, dimethylsulfoxide, γ-butyrolactone, n-methyl-2-pyrrolidone, dimethylacetamide, and dimethylphosphoramide.

After formation of the halide coating on the substrate, the solvent may be removed from the coated substrate, such as by drying at room temperature or other temperature at which the solvent evaporates from the coated substrate. The temperature for solvent removal often ranges from about 18° C. to 100° C.

As will be appreciated by persons skilled in the art, a number of different layer configurations are possible between the ETL and the HTL layers, non-limiting examples of which include (i) (mesoporous n-type oxide infiltrated by perovskite)/(mesoporous p-type oxide infiltrated by perovskite), (ii) (mesoporous n-type oxide infiltrated by perovskite)/(planar perovskite)/(mesoporous p-type oxide infiltrated by perovskite), (iii) (mesoporous n-type oxide infiltrated by perovskite)/(planar perovskite), (iv) (planar perovskite)/(mesoporous p-type oxide infiltrated by perovskite), and (v) (planar perovskite).

The solar cells manufactured by the techniques described herein exhibit improved charge extraction efficiency and low hysteresis due to the use of a halide-SAM providing bonding between the MHP layer and the n-type ETL (or HTL), together with better resistance to delamination and improved structural integrity.

According to one aspect, the normally brittle interface between the MHP thin film and the underlying $SnO_2$ electron-transport layer (ETL) is strengthened to inhibit delamination using a halide-terminated self-assembled monolayer, such as an iodine-terminated self-assembled monolayer ("I-SAM") that acts as a "molecular glue" to bond the MHP thin film to the ETL. This processing step not only increased PCE (up to 21.44%) and reduced hysteresis but also improved operational stability under 1-sun maximum-power-point (MPP) continuous operation (projected T80, time to 80% PCE retention, up to ~4,000 h). The characterization of the operational-stability-tested PSCs demonstrates that the I-SAM helped preserve the mechanical integrity of the ETL/MHP interface, further demonstrating that operational stability is improved with mechanical reliability.

According to one aspect, an iodine-terminated self-assembled monolayer (I-SAM) was used in perovskite solar cells (PSCs) to achieve a 50% increase of adhesion toughness at the interface between the electron transport layer (ETL) and the halide perovskite thin film to enhance mechanical reliability. Treatment with I-SAM also improved the power conversion efficiency from 20.2% to 21.4%, reduced hysteresis, and improved operational stability with a projected T80 (80% of the initial efficiency retained) increasing from ~700 hours to 4,000 hours at 1-sun and with continuous maximum-power-point tracking. Operational-stability-tested PSC without SAMs revealed extensive irreversible morphological degradation at the ETL-perovskite interface, including voids formation and delamination, whereas PSCs with I-SAM exhibited minimal damage accumulation. This difference was attributed to a combination of a decrease in hydroxyl groups at the interface and the higher interfacial toughness.

The following examples are set forth as being representative of the present invention. These examples are not to be construed as limiting the scope of the invention as these and other equivalent embodiments will be apparent in view of the present disclosure, figures and accompanying claims.

EXAMPLE I

Perovskite Solar Cell Fabrication

Perovskite solar cells (PSCs) were fabricated with the following structure: glass/ITO/SnO$_2$ ETL/SAM/MHP/Spiro-OMeTAD HTL/Au, as shown schematically in FIG. 2A (ITO=indium-doped tin oxide; metal halide perovskite (MHP)=Cs$_{0.05}$(FA$_{0.85}$MA$_{0.15}$)$_{0.95}$Pb(I$_{0.85}$Br$_{0.15}$)$_3$ with 4 mol % excess PbI$_2$). The ITO-coated glass was pre-cleaned successively in ultrasonic baths of detergent solution, deionized water, ethanol, acetone, and isopropanol, for 15 min each, and further treated with UV-ozone for 30 min. A dilute SnO$_2$ nanoparticle solution (2.67 wt %) was spin-coated onto the substrates at 3,000 rpm for 30 s and annealed at 150° C. for 30 min to form a compact SnO$_2$ electron transport layer (ETL; ~30 nm thickness) (see Jiang et al., "Enhanced electron extraction using SnO$_2$ for high-efficiency planar-structure HC(NH$_2$)$_2$PbI$_3$-based perovskite solar cells," Nat. Energy 2, 16177 (2016)). For PSCs with H-SAM or with I-SAM, the as-fabricated glass/ITO/SnO$_2$ substrates were submerged in a 5 mM solution of propyltrimethoxysilane (Si(OCH$_3$)$_3$(CH$_2$)$_3$H) or (3-iodopropyl) trimethoxysilane (Si(OCH$_3$)$_3$(CH$_2$)$_3$I), respectively, in isopropanol/DI water (v/v 95/5) for 1 h. Subsequently, the substrates were dried under flowing dry N$_2$ and annealed at 100° C. for 5 min, which were further rinsed with isopropanol several times before drying under N$_2$ again. For PSCs without SAMs, the substrates were treated with UV-ozone for 15 min.

MHP 1.4 M precursor solution was prepared by dissolving appropriate amounts of CsI, FAI, MABr, PbBr$_2$, and PbI$_2$ in DMF/DMSO (v/v 4/1) mixed solvent with 4 mol % excess PbI$_2$. The MHP layer (~500 nm thickness) was deposited by spin-coating the precursor solution at 6.000 rpm for 30 s. At the 20$^{th}$ second of spinning, 250 μL of anti-solvent chlorobenzene was dripped at the center. Subsequently, the as-deposited films were annealed at 110° C. for 50 min.

The Spiro-OMeTAD solution was prepared by dissolving 60 mg of Spiro-OMeTAD with additives in 700 μL of chlorobenzene. 15.5 μL of Li-TFSI solution (520 mg/ml in ACN), 12.5 μL of Co(III) TFSI salt (375 mg/ml in ACN), and 22.5 μL of t-BP were added to the solution. The Spiro-OMeTAD hole transport layer (HTL; ~300 nm thickness) was prepared by spin-coating the solution at 3,000 rpm for 30 s. Both of MHP and HTL deposition were performed in a N$_2$-filled glovebox. Finally, 80-nm of Au layer was thermally-evaporated on top of the HTL as an electrode.

Electron-only transport devices (glass/FTO/SnO$_2$/MHP/PCBM/Ag) without SAMs, and ones with H-SAM or I-SAM at the SnO$_2$/MHP interface (FTO=fluorine-doped tin oxide), were fabricated for current (I) voltage (V) measurements using above methods, where the PCBM was deposited by spin-coating the precursor solution (30 mg/mL in chlorobenzene) at 3.000 rpm for 30 s. A 100-nm of Ag layer was thermally-evaporated on top of the PCBM layer.

The mixed-composition MHP, CS$_{0.05}$(FA$_{0.85}$MA$_{0.15}$)$_{0.95}$Pb(I$_{0.85}$Br$_{0.15}$)$_3$ with 4 mol % excess PbI$_2$ (FA=formamidinium or HC(NH$_2$)$_2$$^+$), optimized for high PCE and stability (see Saliba et al. "Cesium-containing triple cation perovskite solar cells: improved stability, reproducibility and high efficiency." Energy Environ. Sci. 9, 1989-1997 (2016)) was used in the experiments described herein and SnO$_2$ as the ETL was used in the experiments described herein, as it provides a more favorable energy-level alignment with this MHP and minimizes the photocatalytic degradation of the MHP compared to TiO$_2$. The 3-iodopropyl trimethoxysilane (Si(OCH$_3$)$_3$(CH$_2$)$_3$I) I-SAM, with —Si(OCH$_3$)$_3$ anchor group, —I terminal group, and alkyl (CH$_2$), chain (n=3) linker, was used based on the following considerations. First, the surface of SnO$_2$ ETL, as with most oxides (24), is covered with adsorbed hydroxyl (—OH) groups that get trapped during deposition of the MHP thin film on top in n-i-p "regular" planar PSCs, and degrade performance (see Tumen-Ulzii et al., "Hysteresis-less and stable perovskite solar cells with a self-assembled monolayer," Commun. Mater. 1, 31 (2020); Liu et al., "A holistic approach to interface stabilization for efficient perovskite solar modules with over 2,000-hour operational stability," Nat. Energy 5, 596-604 (2020)). Trialkoxysilane SAMs are known to self-assemble and cross-link readily on such oxide surfaces by the silanization process (see Ulman, "Formation and structure of self-assembled monolayers," Chem. Rev. 96. 1533-1554 (1996)) and greatly reduce the number of surface —OH groups as they create anchoring —O—Si bonds. Second, the —I terminal group is expected to form electrostatic bonds to the MHP thin film on top (see Abate et al., "Supramolecular halogen bond passivation of organic-inorganic halide perovskite solar cells," Nano Lett., 14, 3274-3254 (2014)). However, the "brush-like" SAMs morphology due to the short linker alkyl chain length improves interaction between the iodide terminal group and the MHP surface. According to certain aspects, a "brush-like" SAMs morphology refers to the plurality of alkyl linkers with the terminal halogen extending from the substrate surface to which the SAM is covalently attached. Each halide-terminated alkyl linker can be thought of as a strand in a brush. Accordingly, the halide-SAM of the present disclosure includes a plurality of halide terminated alkyl groups. A control H-SAM with —H terminal group (Si (OCH$_3$)$_3$(CH$_2$)$_3$H) was used in separate experiments to isolate the effects of the —I terminal group. Third, the short length of the alkyl chain (n=3) makes the SAMs-coated surface sufficiently lyophilic for the subsequent solution-deposition of the MHP thin film. Finally, SAMs in general (see Schulz et al., "Halide perovskites: Is it all about the interface?" Chem. Rev. 119, 3349-3417 (2019); Kim et al., "Self-assembled monolayers as interface engineering nanomaterials in perovskite solar cells." Adv. Energy Mater. 10. 2002606 (2020)), and trialkoxysilane-based SAMs in particular (see Liu et al., "Fully printable mesoscopic perovskite solar cells with organic silane self-assembled monolayer," J. Am. Chem. Soc. 137, 1790-1793 (2015); Yang et al., "Interface engineering in planar perovskite solar cells: energy level alignment, perovskite morphology control, and high performance achievement," J. Mater. Chem. A 5, 1658-1666 (2017)), increase PCE and reduce hysteresis in PSCs through improved extraction of photocarriers, reduced charge accumulation at interfaces, and passivation of interfacial charge traps.

EXAMPLE II

Mechanical Testing

The "sandwich" double-cantilever beam (DCB) specimens were prepared with the following structure: glass/ITO/SnO$_2$/SAM/MHP/PMMA/epoxy/ITO/glass. The dimension of the ITO-coated glass substrate used is 37.5×12.5×1 mm$^3$. The deposition of SnO$_2$, SAM, and MHP followed the afore-mentioned procedure. To study the effect of the halogen terminal group with the alkyl chain, specimens with Br-SAM ((3-bromopropyl)trimethoxysilane (Si(OCH$_3$)$_3$ (CH$_2$)$_3$Br) were also fabricated. The PMMA layer (~800 nm) was deposited onto MHP for protection by spin-coating the PMMA solution (8 wt % in CB) at 3000 rpm for 60 s. This was allowed to dry at room temperature for 1 h. Subsequently, a thin layer of epoxy (~2 mm) was applied onto the PMMA layer to "glue" another cleaned ITO-coated glass substrate on top. The PMMA layer was necessary to prevent any adverse reactions between the epoxy and the MHP layers. About 5-mm strip at the short edge was masked prior to epoxy application to create a "notch." The DCB specimens were then cured in a drybox for 24 h, and the excess epoxy at the other edges was cleaned off carefully before mechanical testing was conducted.

The DCB specimens were tested using a method known to those of skill in the art (see Rolston et al. (2018); Dai et al.; Kim et al. (2017); Watson et al. (2016)). Briefly, a planar pre-crack was introduced along the width (B=12.5 mm) dimension of the specimen by inserting a razor blade into the "notch." Aluminum tabs were glued to the glass substrates on either side of the "sandwich" specimen at the cracked end of the long dimension (37.5 mm). Initially, a pre-load of 0.2 N was applied to ensure a good contact between the specimen and the instrument. The cracked DCB specimens were then loaded in tension with a displacement rate of 1 μm/s using a delaminator system (DTS, USA) until a well-defined planar crack at the MHP/SnO$_2$ interface was obtained. The load (P)—displacement (A) response was recorded at all times. The specimen was then partially unloaded, and reloaded where the crack length, a, was estimated using the compliance method, in conjunction with the following relation (see Rolston et al. (2018)):

$$a = \left( \frac{d\triangle}{dP} * \frac{BEh^3}{8} \right)^{\frac{1}{3}} - 0.64h, \qquad (S1)$$

where B (=12.5 mm) and E (=70 GPa) are the width and the Young's modulus of the glass substrate, respectively, and h (=1 mm) is the half-thickness of the DCB specimen. The toughness, G$_C$, is then given by the relation (see Rolston et al. (2018)):

$$G_C = \frac{12P_C^2 a^2}{B^2 E h^3} (1 + 0.64 \frac{h}{a})^2, \qquad (S2)$$

where P$_C$ is the load at the onset of non-linearity in the P-D curve during the loading cycle. The loading-unloading cycles were repeated for four more times, and the Gc was calculated for the four cycles (excluding the initial "settling-in" loading cycle). The average Gc is reported for each such test. Examples of loading-unloading curved are presented in FIG. 5. Ten to twelve DCB specimens were tested each for without SAMs, with H-SAM, with I-SAM, and with Br-SAM cases, where the G$_C$ values, the averages, and the standard deviations are reported for each set. The plasticity of the PMMA layer could contribute to the measured G$_C$. However, since the PMMA layer is very thin (~800 nm), that contribution is expected to be insignificant, and it does not affect the observed trends. Nevertheless, caution must be exercised in comparing the G$_C$ values measured here with those measured by others using different specimen-architectures or methods.

The G$_C$ of the DCB specimens after continuous exposure to 1-sun LED illumination (from the SnO$_2$ side) for 120 h and 240 h (in air; ~35° C., ~40% RH) were also measured for (six specimens each): without SAMs, with H-SAM, and with I-SAM. The G$_C$ values, the averages, and the standard deviations are reported for each set.

We measured the adhesion toughness, G$_C$, of the ETL/MHP interface using the "sandwich" double-cantilever beam (DCB) delamination method (FIG. 1A) (see Rolston et al. (2016); Rolston et al. (2018); Dai et al.: Kim et al. (2017)). The SnO$_2$ ETL was deposited on indium-tin-oxide (ITO) coated glass substrates using the method of Jiang et al. The SAM was deposited on the SnO$_2$ surface by dip-coating at room temperature. We note that SAMs deposition is sensitive to several experimental parameters such as water content, solvent used, solution age, deposition time, temperature, etc. (see Ulman). The presence of Si on the H-SAM-coated ETL surface, and both Si and I on the I-SAM-coated ETL surface, was confirmed with X-ray photoelectron spectroscopy (XPS, FIG. 6). The MHP thin film (~500-nm thickness) was then deposited through a variation of the solvent-engineering method (see Jeon et al., "Solvent engineering for high-performance inorganic-organic hybrid perovskite solar cells," *Nat. Mater.* 9, 897-903 (2014)). X-ray diffraction (XRD) patterns of the MHP thin films without SAMs, and ones with H-SAM or I-SAM underneath (FIG. 7) showed no difference in the thin-film MHP phase. Similarly, the top-surface scanning electron microscope (SEM) images in FIGS. 8, A to C, showed no discernable difference in the MHP thin-film microstructure: the average apparent grain sizes of the MHP thin films are between ~330 to ~370 nm.

The G$_C$ of the ETL/MHP interface (FIG. 1B and Table 2 below) was enhanced by ~50% with I-SAM (1.91±0.48 J.m$^{-2}$ to 2.83±0.35 J.m$^{-2}$). For H-SAM, the mechanical bonding with MHP was weak, resulting in a decreased Gc to 1.72±0.54 J.m$^{-2}$. Delamination failure occurred at the ETL/MHP interface in each case; scanning electron microscopy (SEM) images of the mating fracture surfaces are shown in FIGS. 9, A to F. For I-SAM case, the SEM image of the SnO$_2$ ETL side fracture surface showed a few adhered smaller MHP grains due to occasional intergranular fracture.

TABLE 2

| Interfacial toughness (G$_C$) values of 10-12 specimens/tests each of ETL/MHP interface without SAMs, with H-SAM, with I-SAM, and with Br-SAM measured using the DCB delamination method (FIG. 1A). | | | |
|---|---|---|---|
| # | without SAMs G$_C$ (J · m$^{-2}$) | with H-SAM G$_C$ (J · m$^{-2}$) | with I-SAM G$_C$ (J · m$^{-2}$) | with Br-SAM G$_C$ (J · m$^{-2}$) |
| 1 | 1.11 | 0.85 | 2.27 | 1.65 |
| 2 | 1.32 | 1.07 | 2.36 | 1.79 |
| 3 | 1.37 | 1.17 | 2.55 | 1.81 |
| 4 | 1.48 | 1.42 | 2.61 | 1.90 |
| 5 | 1.66 | 1.49 | 2.65 | 1.98 |
| 6 | 1.95 | 1.75 | 2.72 | 2.02 |

TABLE 2-continued

Interfacial toughness ($G_C$) values of 10-12 specimens/tests
each of ETL/MHP interface without SAMs, with H-SAM,
with I-SAM, and with Br-SAM measured using the
DCB delamination method (FIG. 1A).

| # | without SAMs $G_C$ (J · m$^{-2}$) | with H-SAM $G_C$ (J · m$^{-2}$) | with I-SAM $G_C$ (J · m$^{-2}$) | with Br-SAM $G_C$ (J · m$^{-2}$) |
|---|---|---|---|---|
| 7 | 2.09 | 1.82 | 2.79 | 2.26 |
| 8 | 2.19 | 1.82 | 3.09 | 2.32 |
| 9 | 2.32 | 1.91 | 3.11 | 2.36 |
| 10 | 2.41 | 2.21 | 3.12 | 2.66 |
| 11 | 2.44 | 2.37 | 3.33 | — |
| 12 | 2.58 | 2.79 | 3.34 | — |
| Avg. ± SD | 1.91 ± 0.48 | 1.72 ± 0.54 | 2.83 ± 0.35 | 2.08 ± 0.31 |

EXAMPLE III

Characterization

A high-resolution scanning electron microscope (SEM; Quattro ESEM, ThermoFisher Scientific, USA) was used to observe top surfaces, fracture surfaces, and cross-sections of the samples. MHP grain sizes were determined using the linear-intercept method applied to the SEM images, in conjunction with the ImageJ image-analysis software, where 100-200 grains were used for each set of materials. The naturally formed grooves between grains were assumed to represent the grain boundaries, as such the estimated grain size is considered to be the "apparent" grain size.

X-ray diffraction (XRD) of top surfaces of MHP thin films was performed (Cu K$_\square$ radiation) using a high-resolution diffractometer (Discovery D8, Bruker, Germany).

X-ray photoelectron spectroscopy (XPS) of the SAMs-deposited surfaces was performed (K-Alpha, ThermoFisher, USA).

EXAMPLE IV

Device Testing

The J-V characteristics of PSCs were measured using a 2400 source meter (Keithley, USA) under simulated 1-sun illumination (AM1.5G, 100 mW·cm$^{-2}$) which is generated by an Oriel Sol3A Class AAA solar simulator (Newport, USA) in air (RT, 40%-60% RH). The light intensity was calibrated using a standard Si photodiode. Typically, the measurements were performed in reverse (R) scan (from $V_{OC}$ to $J_{SC}$) and forward (F) scan (from $J_{SC}$ to $V_{OC}$) with a step size of 8 mV and a delay time of 10 ms. A typical active area of 0.105 cm$^2$ was defined using a non-reflective mask. All the PSCs were measured without any pre-conditioning. The hysteresis index (%) was determined using the relation (PCER-PCEF/PCEF)×100. The maximum-power output stability of PSCs was measured by monitoring the stabilized current density output at the maximum-power-point (MPP) bias (deduced from the reverse scan J-V curves). External quantum efficiency (EQE) of the PSCs was measured using an internal quantum efficiency system (IQE-200B, Newport, USA) under the irradiation by a 100 W xenon lamp.

For continuous operational-stability test, unencapsulated PSCs were loaded in a sealed chamber with a transparent quartz cover under continuous 1-sun intensity white-LED illumination (Candlelight Systems, Switzerland). A continuous flow of dry N$_2$ was supplied to the chamber to minimize the water and oxygen content in the atmosphere (RT, RH<5%). The light intensity was monitored and maintained throughout the test. The PSCs were biased at the MPP voltage and the PCE was measured every hour with a MPP-tracking routine using a potentiostat with a standard perturb-and-observe algorithm (see Khenkin et al.). J-V characteristics were measured every 12 h.

The J-V characteristics of the PSCs before and at the end of the operational-stability tests were measured using the Keithley-Newport system above.

I-V measurements of the electron-only transport devices using the 2400 source meter (Keithley, USA) were performed in air, from 0 V to 1.2 V with a step size of 0.02 V and a delay time of 1 s. The trap-filled-limited voltages (VTFL) were estimated by linear fitting of the I-V responses. The trap densities were estimated using the following relation:

$$n_{Trap} = \frac{2\varepsilon_0 \varepsilon_r V_{TFL}}{eL^2}, \tag{S3}$$

where $e_o$ is the permittivity of free space, $e_r$ is the relative dielectric constant (~28), e is the elementary electron charge, and Z is the thickness of the MHP layer (~500 nm).

PSCs with planar n-i-p "regular" architecture (FIG. 2A) were fabricated, for different SAMs combinations. Cross-sectional SEM images in FIG. 2, B to D, showed no discernable differences. The current density (J)—voltage (V) response of the "champion" PSCs without SAMs, and ones with H-SAM or I-SAM are presented in FIG. 2E, and the corresponding PV performance parameters are listed in Table 1 below.

TABLE 1

PV performance parameters extracted from the J-V data,
in reverse (R) and forward (F) scans, in FIG. 2E of "champion"
PSCs without SAMs, and ones with H-SAM or I-SAM.

| PSC | Scan | $V_{OC}$ (V) | $J_{SC}$ (mA · cm$^{-2}$) | FF | PCE (%) |
|---|---|---|---|---|---|
| without SAMs | R | 1.131 | 23.02 | 0.774 | 20.15 |
| | F | 1.117 | 22.99 | 0.721 | 18.52 |
| with H-SAM | R | 1.143 | 23.18 | 0.762 | 20.19 |
| | F | 1.142 | 22.86 | 0.760 | 19.84 |
| with I-SAM | R | 1.185 | 23.26 | 0.778 | 21.44 |
| | F | 1.182 | 23.22 | 0.759 | 20.83 |

The I-SAM increased $V_{OC}$, and both PSCs with SAMs showed lower hysteresis indices (1.8% H-SAM and 2.9% I-SAM, versus 8.8% without SAMs). The short-circuit current density ($J_{SC}$) values for all PSCs compared favorably with the respective values derived from the external quantum efficiency (EQE) spectra of these PSCs in FIG. 2F. The stabilized PCE output at MPP of these three PSCs is presented in FIG. 10.

Statistics for the PV performance parameters $J_{SC}$, $V_{OC}$, fill factor (FF), and PCE for 20 each PCSs are presented in FIGS. 11, A to D, with average PCE of without SAMs 19.04±0.49%, with H-SAM 19.04±0.48%, and with I-SAM 20.20±0.62%, confirming overall increased performance of the latter, and also demonstrating reproducibility. The increased PCE in PSCs with I-SAM was largely the result of the increased $V_{OC}$. In this context, the estimated trap-filled-limited voltages ($V_{TFL}$) for electron-only transport devices shown in FIG. 12 were used to estimate trap densities ($n_{Trap}$) of 5.21×10$^{15}$ cm$^{-3}$ for device without SAMs, 1.98×10$^{15}$ cm$^{-3}$ for the device with H-SAM, 1.36×10$^{15}$ cm$^{-3}$ for the device with I-SAM. Increased $V_{OC}$ is attributed to the passivation of charge traps that improved extraction of electrons. The reduced hysteresis with both SAMs was attributed to the reduced charge accumulation with fewer surface —OH groups. Similar increases in PSC performance with different types of SAMs have been demonstrated in several studies (see Tumen-Ulzii et al.; Abate et al.; Schulz et al.; Kim et al. (2020); Liu et al. (2015); Yang et al.).

EXAMPLE V

PSCs Operational Stability Tests

The method for estimating/extrapolating T80 duration of a PSC is described by Khenkin et al., where the steady-state PCE degradation part of the data is fitted to a line. The y-intercept provides the "new" normalized PCE of 1.0. Using this as the reference, time at normalized PCE of 0.8 is the estimated (intrapolated) T80 for PSCs without SAMs and with H-SAM. For extrapolation of T80 for the PSCs with I-SAM, the same procedure is used, except the slope of the linear fit is used to extrapolate to T80. The linear-regression fits to the five operational-stability-tested PSCs in FIG. 3 are:

without SAMs: $y=-2.60\times10^{-4}x+0.8997$ $T80\sim692$ h with H-SAM $y=-2.85\times10^{-4}x+1.0180$ $T80\sim714$ h with I-SAM-1: $y=-6.39\times10^{-5}x+0.9605$ $T80\sim3,006$ h with I-SAM-2: $y=-1.02\times10^{-4}x+0.9671$ $T80\sim1,896$ h with I-SAM-3: $y=-4.64\times10^{-5}x+0.9096$ $T80\sim3,921$ h FIG. 3 presents the operational stability of PSCs under continuous 1-sun illumination with MPP-tracking. In all the tested PSCs, there was initial "burn-in" instability with a decline, rise, or both in PCE followed by linear steady-state degradation, as has been seen previously for single-junction PSCs (see Khenkin et al.). Following a method proposed by Khenkin et al., T80 of PSCs without SAMs is estimated to be about 692 hours and with H-SAM of about 714 h. The steady-state degradation of these PSCs appeared to occur at about the same rate. The extrapolated T80 durations for the three PSCs with I-SAM, assuming linear degradation, were estimated at about 3,006 hours, about 1,896, hours and about 3,921 hours. The normalized PV performance parameters ($J_{SC}$, $V_{OC}$, FF, and PCE) of the PSCs from the J-V responses measured during operational-stability testing are presented in FIGS. 13, A to D. (Note that PCE derived from the J-V response was typically higher than that measured by MPP-tracking (see Khenkin et al.; Saliba et al. (2018)). The performance degradation in the PSC without SAMs was in all three parameters $J_{SC}$, $V_{OC}$, and FF. Table 3 presents PV performance parameters of the PSCs with SAMs, before and after the completion of operational-stability testing, showing decay primarily in $V_{OC}$ and FF.

The operational-stability-tested PSCs were characterized by cross-sectioning one half of each of these devices and deliberately delaminating the other half. Cross-sectional SEM images of the PSC without SAMs (FIG. 4, A to C) showed three types of irreversible morphological-degradation features at the interface compared with the corresponding "before" SEM image in FIG. 2B: small voids, large voids, and delamination. In PSC with H-SAM (FIG. 4D), although voids were not apparent, interfacial delamination was observed. In contrast, such degradation features were not seen in the PSC with I-SAM in the SEM image in FIG. 4E, which looked similar to the corresponding "before" SEM image in FIG. 2D.

FIG. 4, F to I, are SEM images of the perovskite bottom side fracture surfaces of the same delaminated PSCs. Consistent with the cross-sectional observations, the perovskite bottom side fracture surface of the PSC without SAMs showed small voids, large voids (FIG. 4F), and delamination (FIG. 4G). Light-contrast degradation-product particles were also seen in FIGS. 4, F and G, which were absent in the pristine interface (FIG. 9B). In PSC with H-SAM (FIG. 4H) delamination and some voids were observed. In comparison, degradation features in the PSCs with I-SAM were relatively unremarkable (FIG. 4I), which is, once again, consistent with the corresponding cross-sectional SEM image (FIG. 4E).

According to one aspect, the exemplary I-SAM results in reduced severity of irreversible degradation of the ETL/MHP interface, and the attendant decay in the PSC performance. First, both H-SAM and I-SAM should reduce the prevalence of —OH groups at the $SnO_2$ ETL surface. This reduction in positively charged point-defects (see Tumen-Ulzii et al.) should slow down the ion-migration-induced formation of interfacial voids that can serve as sites for photocarriers recombination (see Bi et al., "Multifunctional molecular modulators for perovskite solar cells with over 20% efficiency and high operational stability," *Nat. Commun.* 9, 4482 (2018)) and nucleation of interfacial delamination cracks. The enhanced Gc of the ETL/MHP interface with I-SAM should impede propagation of these incipient interfacial delamination cracks that would block electric current (see Bi et al.). To isolate the effect of light, the DCB specimens without SAMs, and ones with H-SAM or I-SAM were exposed to 1-sun (LED) continuous illumination in air ($\sim35°$ C., $\sim40\%$ relative humidity) from the bottom for 120 h or 240 h, and then tested them to measure the $G_C$. The results in FIG. 14 and Table 4 show that after 240-h exposure there was 14% and 17% loss in the average $G_C$ in without SAMs and with H-SAM cases, respectively, but only 5% for the with I-SAM case. This suggested that the light-induced reduction in $G_C$ in specimens without SAMs and ones with H-SAM, both with initial lower $G_C$ (FIG. 1B), also contributed to the degradation of their respective PSCs.

For experimental purposes, the most brittle interface (ETL/MHP) in PSCs was selected for SAMs-induced toughening for maximum impact. When sufficiently toughened, delamination failure will shift to the next weakest interface in the PSC multilayer stack, and so on (see Ramirez et al.; Rolston et al. (2018)). Accordingly, methods described herein are directed to the use of Halide-SAMs to interconnect other PSC interfaces. Room-temperature solution-deposition of SAMs is a low-cost approach that is amenable to scale-up for batch and/or continuous manufacturing of a wide variety of PSCs (rigid, flexible, tandem).

EXAMPLE VI

Materials

All materials used in the experiments were obtained commercially and used without further purification, which include: N,N-dimethylformamide (DMF; 99.8%, Acros Organics, USA), dimethyl sulfoxide (DMSO; 99.7%. Acros Organics. USA), cesium iodide (CsI; 99.999%. Alfa-Acsar, USA), formamidinium iodide (FAI; Greatcell Solar, Australia), methylammonium bromide (MABr; Greatcell Solar, Australia), Pb(II) iodide ($PbI_2$; 99.99%, TCI), Pb(II) bromide (PbBr$_2$; >98%, Sigma-Aldrich, USA), chlorobenzene (CB: 99.8%. Sigma-Aldrich. USA), (3-iodopropyl) trimethoxysilane (>95%. Sigma-Aldrich, USA), (3-bromopropyl)trimethoxysilane (>97%. Sigma-Aldrich, USA), propyltrimethoxysilanc(>98%, TCI, USA), isopropanol (IPA; 99.5%, Sigma-Aldrich, USA), Spiro-OMeTAD (Merck. Germany), bis(trifluoromethane)sulfonimide lithium salt (LiTFSI; 99.95%. Sigma-Aldrich, USA), Co(III) TFSI salt (FK 209; Greatcell Solar, Australia), acetonitrile (ACN; 99.9%, Acros Organics. USA). 4-tert-butylpyridine (t-BP; 96%. Sigma-Aldrich. USA). [6.6]-phenyl-C$_{61}$-butyric acid methyl ester (PCBM; 1-Material, Canada), tin oxide nanoparticles (SnO$_2$; 15% in H$_2$O, Alfa-Acsar, USA), poly(methyl methacrylate) (PMMA; Sigma-Aldrich, USA), and epoxy adhesive (Hysol. USA).

EXAMPLE VII

Embodiments

Aspects of the present disclosure are directed to a method of bonding an MHP layer to an ETL layer including providing a self-assembled monolayer between the MHP layer and the ETL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer. According to one aspect, the halide of the monomer is iodine, bromine, chlorine or fluorine. According to one aspect, the alkyl linker comprises between 2 and 10 carbon atoms. According to one aspect, the alkyl linker is a straight chain alkyl linker comprising between 2 and 10 carbon atoms. According to one aspect, the alkyl linker is a straight chain alkyl linker comprising between 2 and 5 carbon atoms. According to one aspect, the anchor moiety is a thiol, a carbonyl acid, a carboxylic acid, a phosphonic acid (—P($=$O)(OH)$_2$), a boronic acid (—B(OH)$_2$), a sulphonic acid (—S($=$O) (OH)$_2$), a diol, a thiol, a dithiol, a phosphoric acid, or a silane derivative such as silyl trialkoxide (—Si(OR$_3$). According to one aspect, the anchor moiety represented by —Si—(X)$_3$, where X is a halogen, —OR' and R' is C$_1$ to C$_{10}$ alkyl. According to one aspect, thee anchor moiety is —Si—(OR') wherein R' is methyl, ethyl, propyl or butyl. According to one aspect, the halide is iodine, the alkyl is Ca alkyl and the anchor group is —Si(OCH$_3$)$_3$. According to one aspect, the halide forms a coordination bond with a PbI$_2$-terminated a-FAPbI$_3$ surface. According to one aspect, the MHP comprises formula MeX, wherein Me is a transition metal or a rare earth metal and X is selected from the group consisting of I, Br, Cl, and a combination thereof. According to one aspect, the MHP is represented by formula RMe$_n$X$_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, CH$_3$NH$_3$, NH$_3$CH$=$CH$_2$, Cs, (R'—NH$_3$)$_2$, (NH$_3$—R'—NH$_3$)$_2$ or (R'—NH$_3$)$_2$R$_{(n-1)}$; and R' is alkyl, C$_1$ to C$_4$ alkyl or C$_6$H$_5$C$_2$H$_4$; with the proviso that when y is 3, n is 1, Me is Pb, Sn, Ge, Eu or Yb and R is an organic group, CH$_3$NH$_3$ or NH$_3$CH$=$CH$_2$, or Cs, and further with the proviso that when y is (3n+1) and n is 1, Me is Cu, Co, Ni, Fe, Mn, Pd, Cd, Sn, Pb, Ge, Eu or Yb, and R is (R'—NH$_3$)$_2$ or (NH$_3$—R'—NH$_3$)$_2$ and further with the proviso that when y is (3n+1) and n is 2, 3, 4, or 5, Me is Cu, Co, Ni, F, Mn, Pd, Cd, Sn, Pb, Ge, Eu or Yb and R is (R'—NH$_3$)$_2$R$_{(n-1)}$. According to one aspect, the MHP is CS$_{0.05}$(FA$_{0.85}$MA$_{0.15}$)$_{0.95}$Pb(I$_{0.85}$Br$_{0.15}$)$_3$ with 4 mol % excess PbI$_2$. According to one aspect, the ETL comprises TiO$_2$, SnO$_2$ or ZnO. According to one aspect, the self-assembled monolayer comprises a plurality of iodine terminated alkyl moieties. According to one aspect, a laminated structure is provided including a self-assembled monolayer between an MHP layer and an ETL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer. According to one aspect, a solar cell is providing including a self-assembled monolayer between an MHP layer and an ETL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer.

Aspects of the present disclosure are directed to a method of bonding an MHP layer to an HTL layer including providing a self-assembled monolayer between the MHP layer and the HTL layer, wherein the self-assembled monolayer is formed from a monomer of formula halide-alkyl linker-anchor moiety, wherein the anchor moiety covalently bonds to the HTL layer and the halide forms a coordination bond with a halide at the surface of the MHP layer. According to one aspect, the halide of the monomer is iodine, bromine, chlorine or fluorine. According to one aspect, the alkyl linker comprises between 2 and 10 carbon atoms. According to one aspect, the alkyl linker is a straight chain alkyl linker comprising between 2 and 10 carbon atoms. According to one aspect, the alkyl linker is a straight chain alkyl linker comprising between 2 and 5 carbon atoms. According to one aspect, the anchor moiety is a thiol, a carbonyl acid, a carboxylic acid, a phosphonic acid (—P($=$O)(OH)$_2$), a boronic acid (—B(OH)$_2$), a sulphonic acid (—S($=$O) (OH)$_2$), a diol, a thiol, a dithiol, a phosphoric acid, or a silane derivative such as silyl trialkoxide (—Si(OR$_3$). According to one aspect, the anchor moiety represented by —Si—(X)$_3$, where X is a halogen, —OR' and R' is C$_1$ to C$_{10}$ alkyl. According to one aspect, the anchor moiety is —Si—(OR') wherein R' is methyl, ethyl, propyl or butyl. According to one aspect, the halide is iodine, the alkyl is C$_3$ alkyl and the anchor group is Si(OCH$_3$)$_3$. According to one aspect, the halide forms a coordination bond with a PbI$_2$-terminated a-FAPbI$_3$ surface. According to one aspect. the MHP comprises formula MeX, wherein Me is a transition metal or a rare earth metal and X is selected from the group consisting of I, Br, Cl, and a combination thereof. According to one aspect, the MHP is represented by formula RMe$_n$X$_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, CH$_3$NH$_3$, NH$_3$CH$=$CH$_2$, Cs, (R'—NH$_3$)$_2$, (NH$_3$—R'—NH$_3$)$_2$ or (R'—NH$_3$)$_2$R$_{(n-1)}$; and R' is alkyl, C$_1$ to C$_4$ alkyl or C$_6$H$_5$C$_2$H$_4$; with the proviso that when y is 3, n is 1, Me is Pb, Sn, Ge, Eu or Yb and R is an organic group, CH$_3$NH$_3$ or NH$_3$CH$=$CH$_2$, or Cs, and further with the proviso that when y is (3n+1) and n is 1, Me is Cu, Co, Ni, Fe, Mn, Pd, Cd, Sn, Pb, Ge, Eu or Yb, and R is (R'—NH$_3$)$_2$ or (NH$_3$—R'—NH$_3$)$_2$ and further with the proviso that when y is (3n+1) and n is 2, 3, 4, or 5, Me is Cu, Co, Ni, Fe, Mn, Pd, Cd, Sn, Pb, Ge, Eu or Yb and R is (R'—NH$_3$)$_2$R$_{(n-1)}$. According to one aspect, the MHP is CS$_{0.05}$(FA$_{0.85}$MA$_{0.15}$)$_{0.95}$Pb(I$_{0.85}$Br$_{0.15}$)$_3$ with 4 mol % excess PbI$_2$. According to one aspect, the HTL comprises NiO$_x$, where x is 0.8 to 1.2. According to one aspect, the self-assembled monolayer comprises a plurality of iodine terminated alkyl moieties. According to one aspect, a laminated structure is provided including a self-assembled monolayer between an MHP layer and an HTL layer, wherein the self-assembled monolayer is formed from a monomer of formula halide-alkyl linker-anchor moiety, wherein the anchor moiety covalently bonds to the HTL layer and the halide forms a coordination bond with a halide at the surface of the MHP layer. According to one aspect, a solar cell is provided including a self-assembled monolayer between an MHP layer and an HTL layer, wherein the self-assembled monolayer is formed from a monomer of formula halide-alkyl linker-anchor moiety, wherein the anchor moiety covalently bonds to the HTL layer and the halide forms a coordination bond with a halide at the surface of the MHP layer.

The present disclosure provides a method of bonding an MHP layer to an ETL layer and an HTL layer including providing a self-assembled monolayer between the MHP layer and the ETL layer, providing a self-assembled monolayer between the MHP later and the HTL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer, and wherein the anchor moiety covalently bonds to the HTL layer and the halide forms a coordination bond with a halide at the surface of the MHP layer. According to one aspect, a laminated structure is provided including a self-assembled monolayer between an MHP layer and an ETL layer, and a self-assembled monolayer between the MHP layer and an HTL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer, and wherein the anchor moiety covalently bonds to the HTL layer and the halide forms a coordination bond with a halide at the surface of the MHP layer. According to one aspect, a solar cell is provided including a self-assembled monolayer between an MHP layer and an ETL layer, and a self-assembled monolayer between the MHP layer and an HTL layer, wherein the self-assembled monolayer is formed from a monomer of formula halide-alkyl linker-anchor moiety, wherein the anchor moiety covalently bonds to the ETL layer and the halide forms a coordination bond with a halide at the surface of the MHP layer, and wherein the anchor moiety covalently bonds to the HTL layer and the halide forms a coordination bond with a halide at the surface of the MHP layer.

It is to be understood that the embodiments of the present invention which have been described are merely illustrative of some of the applications of the principles of the present invention. Numerous modifications may be made by those skilled in the art based upon the teachings presented herein without departing from the true spirit and scope of the invention. The contents of all references, patents and published patent applications cited throughout this application are hereby incorporated by reference in their entirety for all purposes.

What is claimed is:

1. A method of bonding a metal halide perovskite ("MHP") layer to an electron transport ("ETL") layer comprising:

providing a self-assembled monolayer between the MHP layer and the ETL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, with the proviso that the anchor moiety is not carboxylic acid.

2. The method of claim 1 wherein the halide of the monomer is iodine, bromine, chlorine or fluorine.

3. The method of claim 1 wherein the alkyl linker comprises between 2 and 10 carbon atoms.

4. The method of claim 1 wherein the alkyl linker is a straight chain alkyl linker comprising between 2 and 10 carbon atoms.

5. The method of claim 1 wherein the alkyl linker is a straight chain alkyl linker comprising between 2 and 5 carbon atoms.

6. The method of claim 1 wherein the anchor moiety is a carbonyl acid, a phosphonic acid ($-P(=O)(OH)_2$), a boronic acid ($-B(OH)_2$), a sulphonic acid ($-S(=O)(OH)_2$), a diol, a thiol, a dithiol, a phosphoric acid, or a silane derivative.

7. The method of claim 1 wherein the halide forms a coordination bond with a $PbI_2$-terminated a-$FAPbI_3$ surface.

8. The method of claim 1 wherein the MHP comprises formula MeX, wherein Me is a transition metal or a rare earth metal and X is selected from the group consisting of I, Br, Cl, and a combination thereof.

9. The method of claim 1 wherein the MHP is represented by formula $RMe_nX_y$, wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, $CH_3NH_3$, $NH_3CH=CH_2$, Cs, ($R'-NH_3)_2$, ($NH_3-R'-NH_3)_2$ or ($R'-NH_3)_2R$ (n-1); and R' is alkyl, $C_1$ to $C_4$ alkyl or $C_6H_5C_2H_4$; with the proviso that when y is 3, n is 1, Me is Pb, Sn, Ge, Eu or Yb and R is an organic group, $CH_3NH_3$ or $NH_3CH-CH_2$, or Cs, and further with the proviso that when y is (3n+1) and n is 1, Me is Cu, Co, Ni, Fe, Mn, Pd, Cd, Sn, Pb, Ge, Eu or Yb, and R is ($R'-NH_3)_2$ or ($NH_3-R'-NH_3)_2$ and further with the proviso that when y is (3n+1) and n is 2, 3, 4, or 5, Me is Cu, Co, Ni, Fe, Mn, Pd, Cd, Sn, Pb, Ge, Eu or Yb and R is ($R'-NH_3)_2R_{(n-1)}$.

10. The method of claim 1 wherein the ETL comprises $TiO_2$, $SnO_2$ or ZnO.

11. The method of claim 1 wherein the self-assembled monolayer comprises a plurality of iodine terminated alkyl moieties.

12. A method of bonding a metal halide perovskite ("MHP") layer to an electron transport ("ETL") layer comprising:

providing a self-assembled monolayer between the MHP layer and the ETL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, wherein the anchor moiety is represented by $-Si-(X)_3$, where X is a halogen, or $-OR'$ and R' is $C_1$ to $C_{10}$ alkyl.

13. A method of bonding a metal halide perovskite ("MHP") layer to an electron transport ("ETL") layer comprising:

providing a self-assembled monolayer between the MHP layer and the ETL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, wherein the anchor moiety is —Si—(OR') wherein R' is methyl, ethyl, propyl or butyl.

14. A method of bonding a metal halide perovskite ("MHP") layer to an electron transport ("ETL") layer comprising:

providing a self-assembled monolayer between the MHP layer and the ETL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, wherein the halide is iodine, the alkyl is $C_3$ alkyl and the anchor group is —Si(OCH$_3$)$_3$.

15. A method of bonding a metal halide perovskite ("MHP") layer to an electron transport ("ETL") layer comprising:

providing a self-assembled monolayer between the MHP layer and the ETL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, wherein the MHP is $CS_{0.05}(FA_{0.85}MA_{0.15})_{0.95}Pb(I_{0.85}Br_{0.15})_3$ with 4 mol % excess $PbI_2$.

16. A method of bonding a metal halide perovskite ("MHP") layer to a hole-transport layer ("HTL") layer comprising:

providing a self-assembled monolayer between the MHP layer and the HTL layer, wherein the self-assembled monolayer is formed from a monomer of formula I below halide-alkyl linker-anchor moiety, wherein the anchor moiety covalently bonds to the HTL layer and the halide forms a coordination bond with a halide at the surface of the MHP layer, with the proviso that the anchor moiety is not a carboxylic acid.

17. The method of claim 16 wherein the halide of the monomer is iodine, bromine, chlorine or fluorine.

18. The method of claim 16 wherein the alkyl linker comprises between 2 and 10 carbon atoms.

19. The method of claim 16 wherein the alkyl linker is a straight chain alkyl linker comprising between 2 and 10 carbon atoms.

20. The method of claim 16 wherein the alkyl linker is a straight chain alkyl linker comprising between 2 and 5 carbon atoms.

21. The method of claim 16 wherein the anchor moiety is a carbonyl acid, a phosphonic acid (—P(=O)(OH)$_2$), a boronic acid (—B(OH)$_2$), a sulphonic acid (—S(=O) (OH)$_2$), a diol, a thiol, a dithiol, a phosphoric acid, or a silane derivative such as silyl trialkoxide (—Si(OR$_3$).

22. The method of claim 16 wherein the anchor moiety represented by —Si—(X)$_3$, where X is a halogen, or —OR' and R' is $C_1$ to $C_{10}$ alkyl.

23. The method of claim 16 wherein the anchor moiety is —Si—(OR') wherein R' is methyl, ethyl, propyl or butyl.

24. The method of claim 16 wherein the halide is iodine, the alkyl is $C_3$ alkyl and the anchor group is —Si(OCH$_3$)$_3$.

25. The method of claim 16 wherein the halide forms a coordination bond with a $PbI_2$-terminated a-FAPbI$_3$ surface.

26. The method of claim 16 wherein the MHP comprises formula MeX, wherein Me is a transition metal or a rare earth metal and X is selected from the group consisting of I, Br, Cl, and a combination thereof.

27. The method of claim 16 wherein the MHP is represented by formula $RMe_nX_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, $CH_3NH_3$, $NH_3CH=CH_2$, Cs, (R'—NH$_3$)$_2$, (NH$_3$—R'— NH$_3$)$_2$ or (R'—NH$_3$)$_2$R (n–1); and R' is alkyl, $C_1$ to $C_4$ alkyl or $C_6H_5C_2H_4$; with the proviso that when y is 3, n is 1, Me is Pb, Sn, Ge, Eu or Yb and R is an organic group, $CH_3NH_3$ or $NH_3CH=CH_2$, or Cs, and further with the proviso that when y is (3n+1) and n is 1, Me is Cu, Co, Ni, Fe, Mn, Pd, Cd, Sn, Pb, Ge, Eu or Yb, and R is (R'—NH$_3$)$_2$ or (NH$_3$— R'—NH$_3$)$_2$ and further with the proviso that when y is (3n+1) and n is 2, 3, 4, or 5, Me is Cu, Co, Ni, Fe, Mn, Pd, Cd, Sn, Pb, Ge, Eu or Yb and R is (R'—NH$_3$)$_2$R$_{(n-1)}$.

28. The method of claim 16 wherein the MHP is $CS_{0.05}$ $(FA_{0.85}MA_{0.15})_{0.95}Pb(I_{0.85}Br_{0.15})_3$ with 4 mol % excess $PbI_2$.

29. The method of claim 16 wherein the HTL comprises $NiO_x$, where x is 0.8 to 1.2.

30. The method of claim 16 wherein the self-assembled monolayer comprises a plurality of iodine terminated alkyl moieties.

31. A method of bonding a metal halide perovskite layer ("MHP") layer to an electron transport layer ("ETL") layer and a hole transport layer ("HTL") layer comprising:

providing a self-assembled monolayer between the MHP layer and the ETL layer, providing a self-assembled monolayer between the MHP layer and the HTL layer, wherein the self-assembled monolayer is formed from a monomer of formula I below halide-alkyl linker-anchor moiety, wherein the anchor moiety covalently bonds to the ETL layer and the halide forms a coordination bond with a halide at the surface of the MHP layer, and wherein the anchor moiety covalently bonds to the HTL layer and the halide forms a coordination bond with a halide at the surface of the MHP layer, with the proviso that the anchor moiety is not a carboxylic acid.

* * * * *